(12) United States Patent  
Poon et al.

(10) Patent No.: US 6,281,655 B1
(45) Date of Patent: Aug. 28, 2001

(54) HIGH PERFORMANCE STAGE ASSEMBLY

(75) Inventors: Alex Ka Tim Poon, San Ramon; Douglas Watson, Campbell, both of CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/471,740

(22) Filed: Dec. 23, 1999

(51) Int. Cl.⁷ .................................................. B64C 17/06
(52) U.S. Cl. ........................ 318/649; 318/592; 318/575; 318/568.17; 74/471 R
(58) Field of Search ................................. 318/649, 592, 318/575, 568.17; 74/471 XY, 471 R

(56) References Cited

U.S. PATENT DOCUMENTS

| | | | | |
|---|---|---|---|---|
| 3,652,146 | * | 3/1972 | George | 350/86 |
| 4,538,885 | * | 9/1985 | Graham et al. | 350/529 |
| 4,979,195 | * | 12/1990 | Tabata et al. | 378/34 |
| 5,073,912 | * | 12/1991 | Lobayashi et al. | 378/34 |
| 5,142,791 | * | 9/1992 | Kobayashi et al. | 33/573 |
| 5,377,009 | * | 12/1994 | Kitaoka et al. | 356/401 |
| 5,623,853 | * | 4/1997 | Novak et al. | 74/490.09 |
| 5,877,845 | * | 3/1999 | Makinoushi | 355/53 |
| 6,069,417 | * | 5/2000 | Yuan et al. | 310/12 |
| 6,130,517 | * | 10/2000 | Yuan et al. | 318/640 |

* cited by examiner

Primary Examiner—Bentsu Ro
Assistant Examiner—Rita Leypkin
(74) Attorney, Agent, or Firm—Jim Rose; Steven G. Roeder

(57) ABSTRACT

A stage assembly (10) for moving and positioning one or more objects (24) for an exposure apparatus (28) is provided herein. The stage assembly (10) includes a fine stage (14) and a coarse stage (18). The fine stage (14) includes a holder (15) that retains the object (24). The stage assembly (10) also includes a fine Y mover (32) and a fine X mover (34) that precisely move the fine stage (14) relative to the coarse stage (18). Uniquely, the fine movers (32), (34) are positioned on only one side of the holder (15). With this design, the resulting stage assembly (10) has a relatively low mass and a relatively high servo bandwidth. Further, with this design, the stage assembly (10) is readily accessible for service and a measurement system (16) can be easily positioned near the fine stage (14). The stage assembly (10) can also include an anti-gravity mechanism (40) that minimizes distortion of a stage base (12) that supports the fine stage (14) as the fine stage (14) moves above the stage base (12). Additionally, the stage assembly (10) can include a reaction assembly (20) that reduces the amount of reaction forces transferred from the coarse stage (18).

67 Claims, 14 Drawing Sheets

HIGH PERFORMANCE STAGE ASSEMBLY

FIELD OF THE INVENTION

The present invention is directed to a stage for an exposure apparatus. More specifically, the present invention is directed to a low mass, high performance stage for an exposure apparatus.

BACKGROUND

Exposure apparatuses are commonly used to transfer images from a reticle onto a semiconductor wafer during semiconductor processing. A typical exposure apparatus includes an illumination source, a reticle stage retaining a reticle, a lens assembly and a wafer stage retaining a semiconductor wafer. The reticle stage and the wafer stage are supported above a ground with an apparatus frame. Typically, one or more motors precisely position the wafer stage and one or more motors precisely position the reticle stage. The images transferred onto the wafer from the reticle are extremely small. Accordingly, the precise relative positioning of the wafer and the reticle is critical to the manufacturing of high density, semiconductor wafers.

A typical reticle stage includes a coarse stage and a fine stage. The coarse stage is used for relatively large movements of the reticle and the fine stage is used for relatively small, precise movements of the reticle. Existing reticle stages typically utilize a pair of spaced apart fine Y motors to move the fine stage along a Y axis and a pair of spaced apart coarse Y motors to move the coarse stage along the Y axis.

Unfortunately, existing reticle stages that utilize both a coarse stage and a fine stage have a relatively large total mass. As a result of the large mass, large motors are needed to move and position the fine stage and the coarse stage. These motors occupy valuable space near the stage, consume large amounts of electric current and generate a significant amount of heat. The heat is subsequently transferred to the surrounding environment, including the air surrounding the motors and the other components positioned near the motors. The heat changes the index of refraction of the surrounding air. This reduces the accuracy of any metrology system used to monitor the positions of the stages and degrades machine positioning accuracy. Additionally, the heat causes expansion of the other components of the device. This further degrades the accuracy of the device.

Moreover, a large mass, reticle stage has a relatively low resonant frequency and a low servo bandwidth. As a result of the low resonant frequency and low servo bandwidth, external forces and/or small reaction forces can easily vibrate and distort the reticle stage. This will influence the position of the reticle stage and the performance of the exposure apparatus.

Additionally, the multiple motors required for both the coarse stage and the fine stage complicates the layout of the reticle stage and the system required to control both the coarse stage and the fine stage.

In light of the above, it is an object of the present invention to provide a stage assembly that has a relatively low mass, a relatively high resonance frequency and a relatively high servo bandwidth. Another object is to provide a stage assembly that is relatively simple to control, allows space for service access, and allows space for a measurement system. Still another object is to provide a stage assembly that utilizes efficient motors to move the components of the stage assembly. Yet another object is to provide a low mass stage assembly that can simultaneously carry two reticles. Another object is to provide a stage assembly that offsets the mass of a fine stage to minimize distortion to a stage base and a lens assembly. Another object is to provide a stage that utilizes reaction force cancellation to minimize the forces transferred to a mounting frame. Still another object is to provide an exposure apparatus capable of manufacturing high density, semiconductor wafers. Yet another object is to provide a stage assembly having a guideless fine stage and a guideless coarse stage.

SUMMARY

The present invention is directed to a stage assembly for moving an object that satisfies these needs. The stage assembly includes a fine stage and a coarse stage. The fine stage includes a holder that retains the object. As provided herein, the stage assembly can be used to precisely position one or more objects during a manufacturing and/or an inspection process.

The stage assembly includes a fine Y mover and a fine X mover that precisely move the fine stage relative to the coarse stage. Additionally, the stage assembly can also include a coarse Y mover and a coarse X mover that move the coarse stage relative to a reaction assembly. Uniquely, the fine movers and the coarse movers are positioned on only one side of the holder. With this design, the fine stage has a relatively low mass and a relatively high servo bandwidth. Because of the low mass, smaller movers can be used to move the fine stage. Because of the high servo bandwidth, external forces and small reaction forces are less likely to influence the position of the fine stage. This allows for more accurate positioning of the object by the stages and the production of higher quality wafers. Further, with this design, the stage assembly is easily accessible for service and the measurement system can be easily positioned near the fine stage.

Moreover, both the fine stage and the coarse stage are guideless along the X axis, along the Y axis and about the Z axis. More specifically, both the fine stage and the coarse stage are not constrained along the Y axis, the X axis and about the Z axis. Stated another way, each stage can be moved with at least three degrees of freedom. With this design, the movers control the position of the stages along the X axis, along the Y axis and about the Z axis. This allows for more accurate positioning of the stages and better performance of the stage assembly.

Further, the stage assembly can also include an antigravity mechanism that urges the fine stage upwards towards the coarse stage. This minimizes distortion to a stage base that supports the fine stage as the fine stage moves above the stage base.

Additionally, the stage assembly can include a mounting frame that supports the reaction assembly and allows the reaction assembly to move relative to the mounting frame. With this design, the reaction assembly reduces the amount of reaction forces from the coarse movers that is transferred to the ground.

The present invention is also directed to a method for moving an object, a method for manufacturing a stage assembly, a method for manufacturing an exposure apparatus and a method for manufacturing a wafer and a device.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
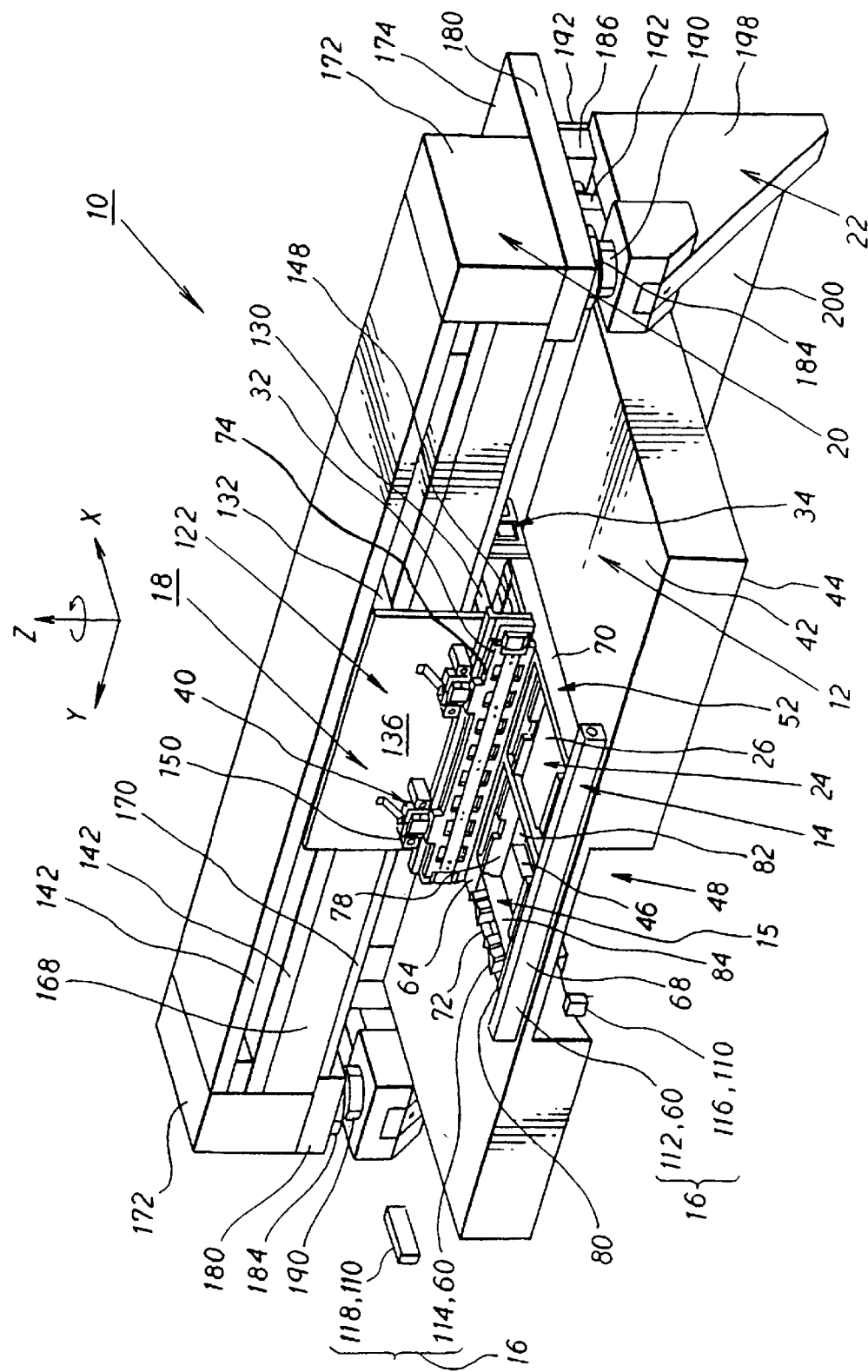
FIG. 1 is an upper perspective view of a stage assembly having features of the present invention.
Figure 2:
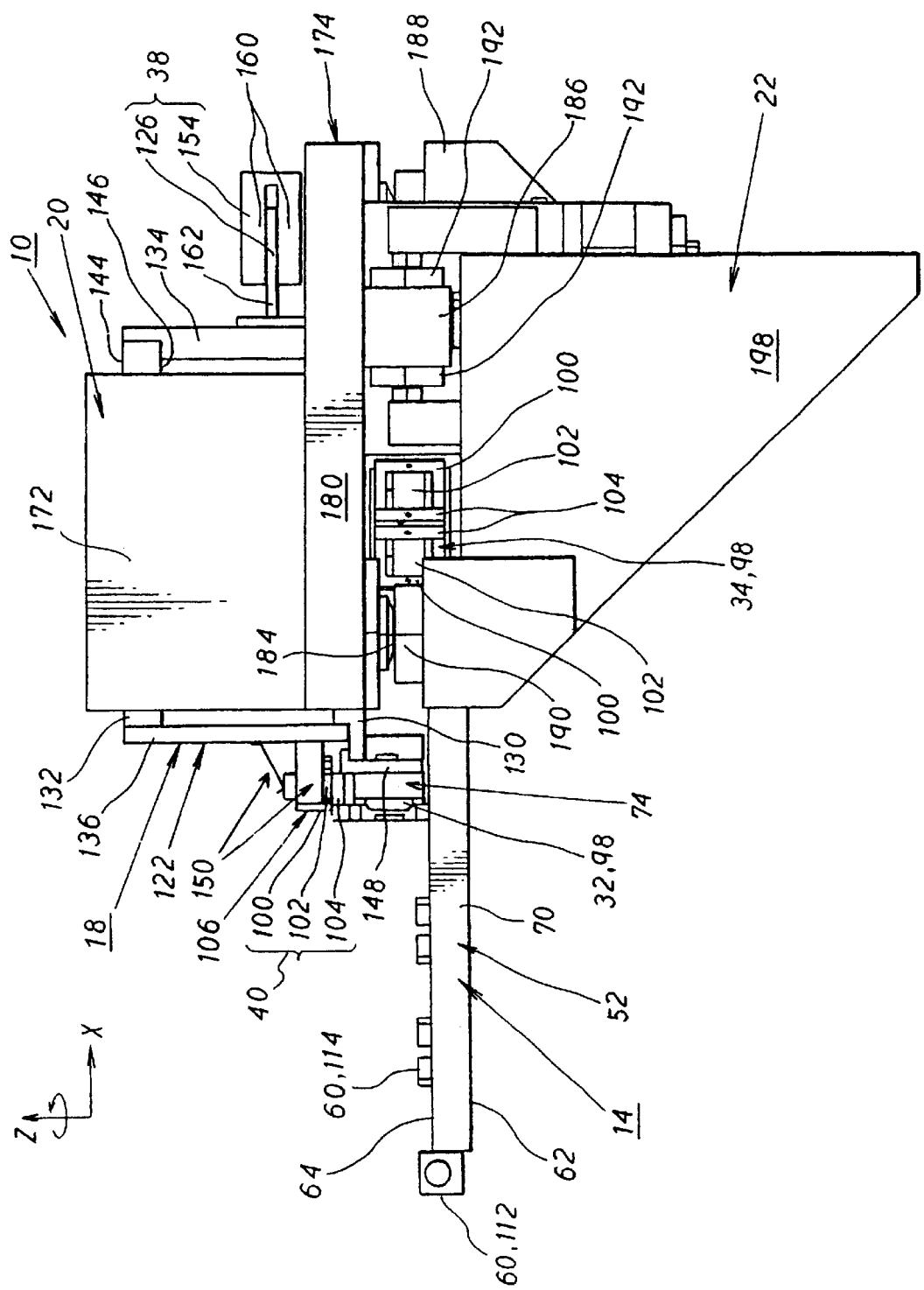
FIG. 2 is front plan view of the stage assembly of FIG. 1, with a stage base and a measurement system omitted for clarity.
Figure 3:
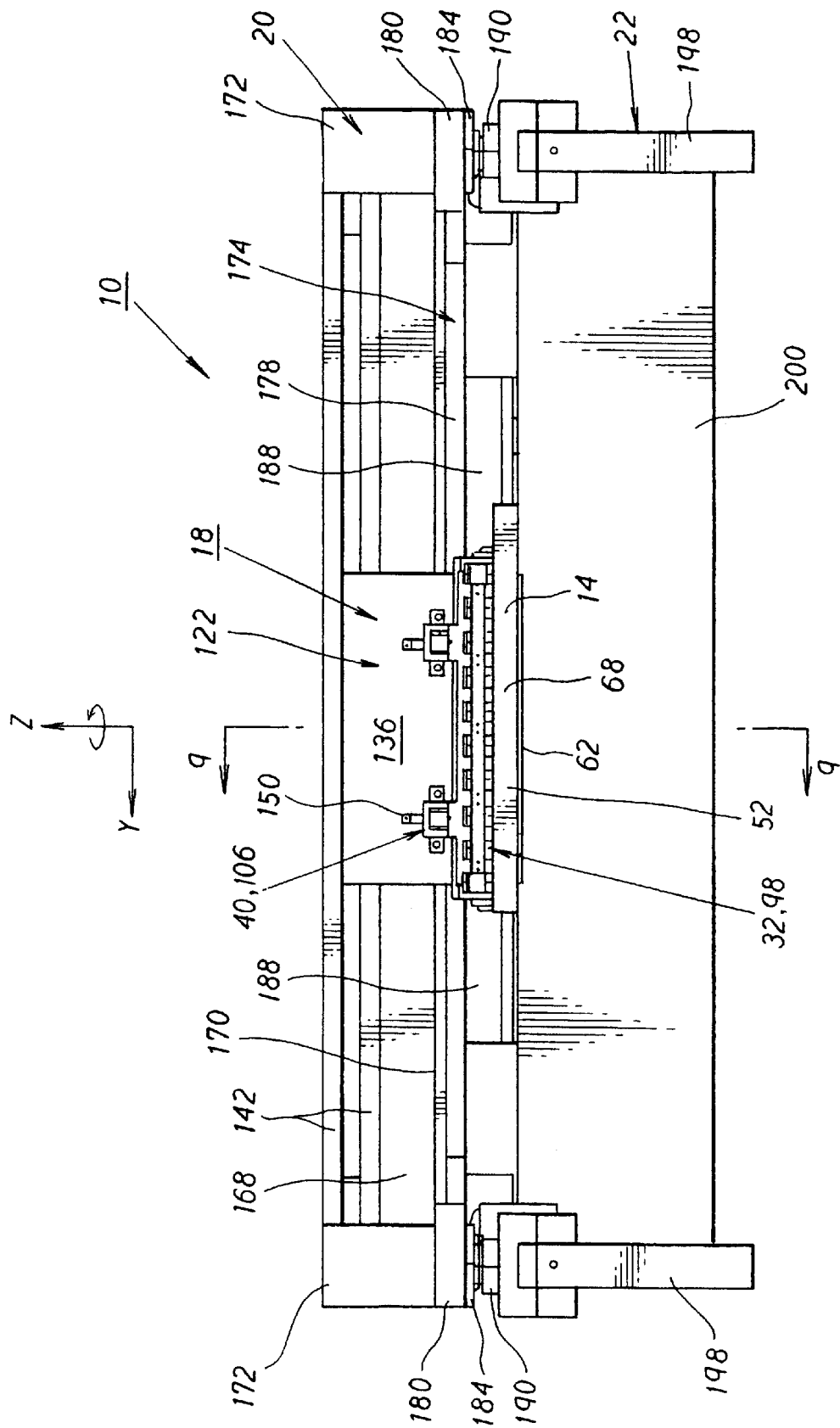
FIG. 3 is a side plan view of the stage assembly of FIG. 1, with the stage base and the measurement system omitted for clarity.

Referring initially to FIGS. 1–4, a stage assembly 10 having features of the present invention includes a stage base 12, a fine stage 14 including a holder 15, a measurement system 16, a coarse stage 18, a reaction assembly 20 and a mounting frame 22. The stage assembly 10 is useful for precisely positioning one or more objects 24 during a manufacturing and/or inspection process.

The type of object 24 positioned and moved by the stage assembly 10 can be varied. In the embodiments provided herein, each object 24 is a reticle 26 and the stage assembly 10 is useful as part of an exposure apparatus 28 (illustrated in FIG. 13) for precisely positioning each reticle 26 during the manufacture of a semiconductor wafer 30 (illustrated in FIG. 13). Alternately, for example, the stage assembly 10 can be used to retain a reticle during reticle manufacturing, an object under an electron microscope (not shown), an object during a precision measurement operation, or an object during a precision manufacturing operation.

As an overview, the stage assembly 10 also includes a fine Y mover 32, a fine X mover 34, a coarse Y mover 36, a coarse X mover 38 and an anti-gravity mechanism 40. The fine Y mover 32 and the fine X mover 34 precisely move the fine stage 14 relative to the coarse stage 18. The coarse Y mover 36 (illustrated in FIGS. 9 and 10) and the coarse X mover 38 move the coarse stage 18 relative to the reaction assembly 20. The anti-gravity mechanism 40 minimizes distortion of the stage base 12 as the fine stage 14 moves above the stage base 12.

The fine stage movers 32, 34 and the coarse stage movers 36, 38 are uniquely positioned on only one side of the holder 15. With this design, the fine stage 14 has a relatively low mass and a relatively high servo bandwidth. Because of the low mass, smaller movers 32, 34 can be used to move the fine stage 14. The smaller movers 32, 34 generate less heat and consume less energy. Because of the high servo bandwidth, external forces and small reaction forces are less likely to influence the position of the fine stage 14. This allows for more accurate positioning of the object 24 by the stages 14, 18 and the production of higher quality wafers 30. Further, with this design, the stage assembly 10 is readily accessible for service and the measurement system 16 can be easily positioned near the fine stage 14.

Some of the Figures provided herein include a coordinate system that designates an X axis, a Y axis and a Z axis. It should be understood that the coordinate system is merely for reference and can be varied. For example, the X axis can be switched with the Y axis.

Importantly, as provided herein, both the fine stage 14 and the coarse stage 18 are guideless along the X axis, along the Y axis and about the Z axis. More specifically, both the fine stage 14 and the coarse stage 18 are not constrained along the Y axis, the X axis and about the Z axis. Stated another way, each stage 14, 18 can be moved with at least three degrees of freedom. With this design, the fine movers 32, 34 precisely control the position of the fine stage 14 along the X axis, along the Y axis and about the Z axis and the coarse movers 36, 38 control the position of the coarse stage 18 along the X axis, along the Y axis and about the Z axis. This allows for more accurate control over the positions of the stages 12, 14 and better performance of the stage assembly 10.

The stage base 12 supports the fine stage 14 during movement. The design of the stage base 12 can be varied to suit the design requirements of the stage assembly 10. In the embodiment illustrated in FIG. 1, the stage base 12 is a generally rectangular shaped plate. The stage base 12 includes a planar upper base surface 42 and an opposed, lower base surface 44. The stage base 12 also includes a base aperture 46 and a lens cut-out 48. The base aperture 46 extends through the stage base 12 and allows for the passage of light through the stage base 12. The lens cut-out 48 is somewhat cylindrical shaped and extends partly into the stage base 12 from the lower base surface 44. The lens cut-out 48 allows for the positioning of a lens assembly 50 (illustrated in FIG. 13) near the first stage 14.

Figure 4:
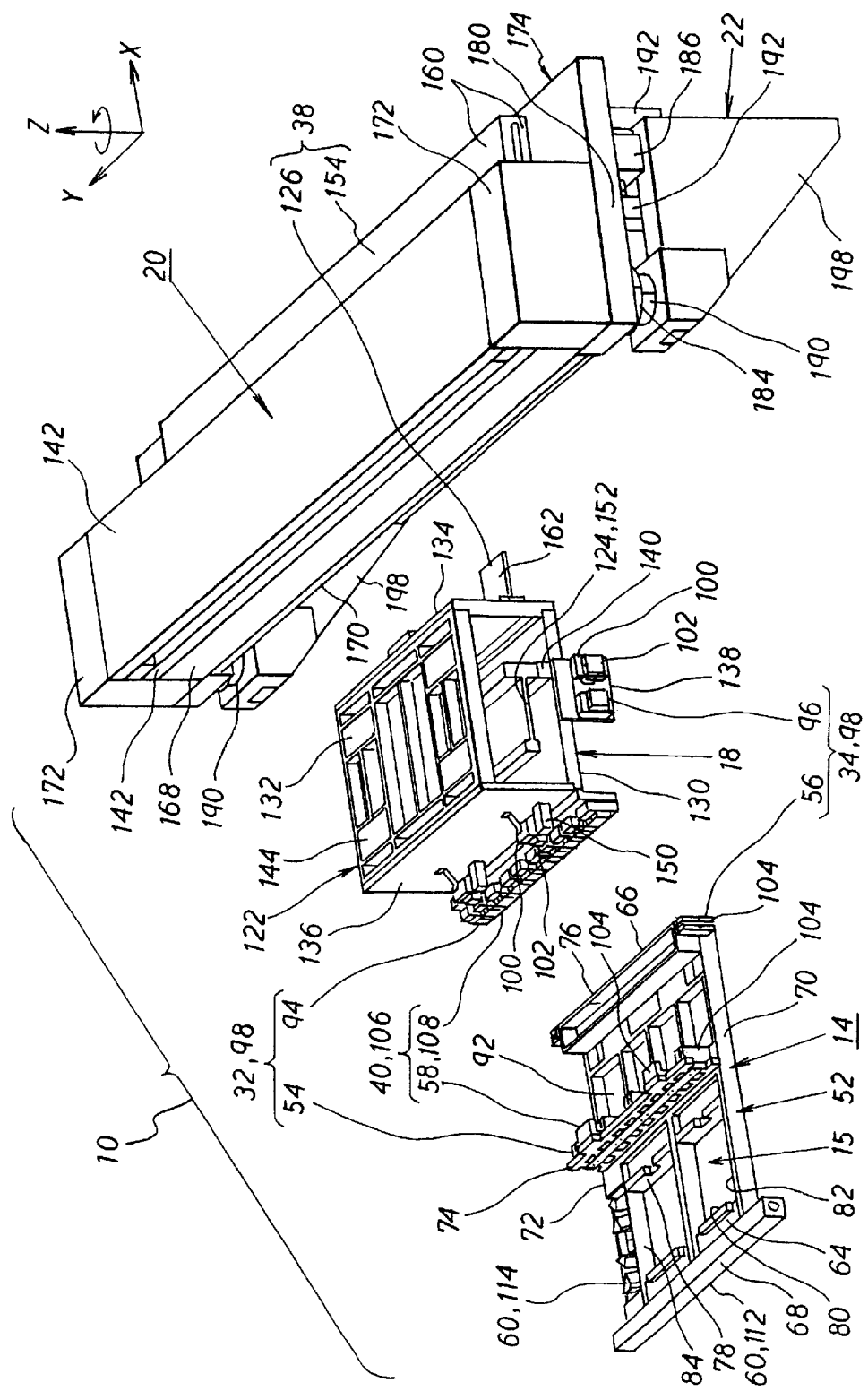
FIG. 4 is an exploded perspective view of the stage assembly of FIG. 1, without the stage base and the measurement system.
Figure 5:
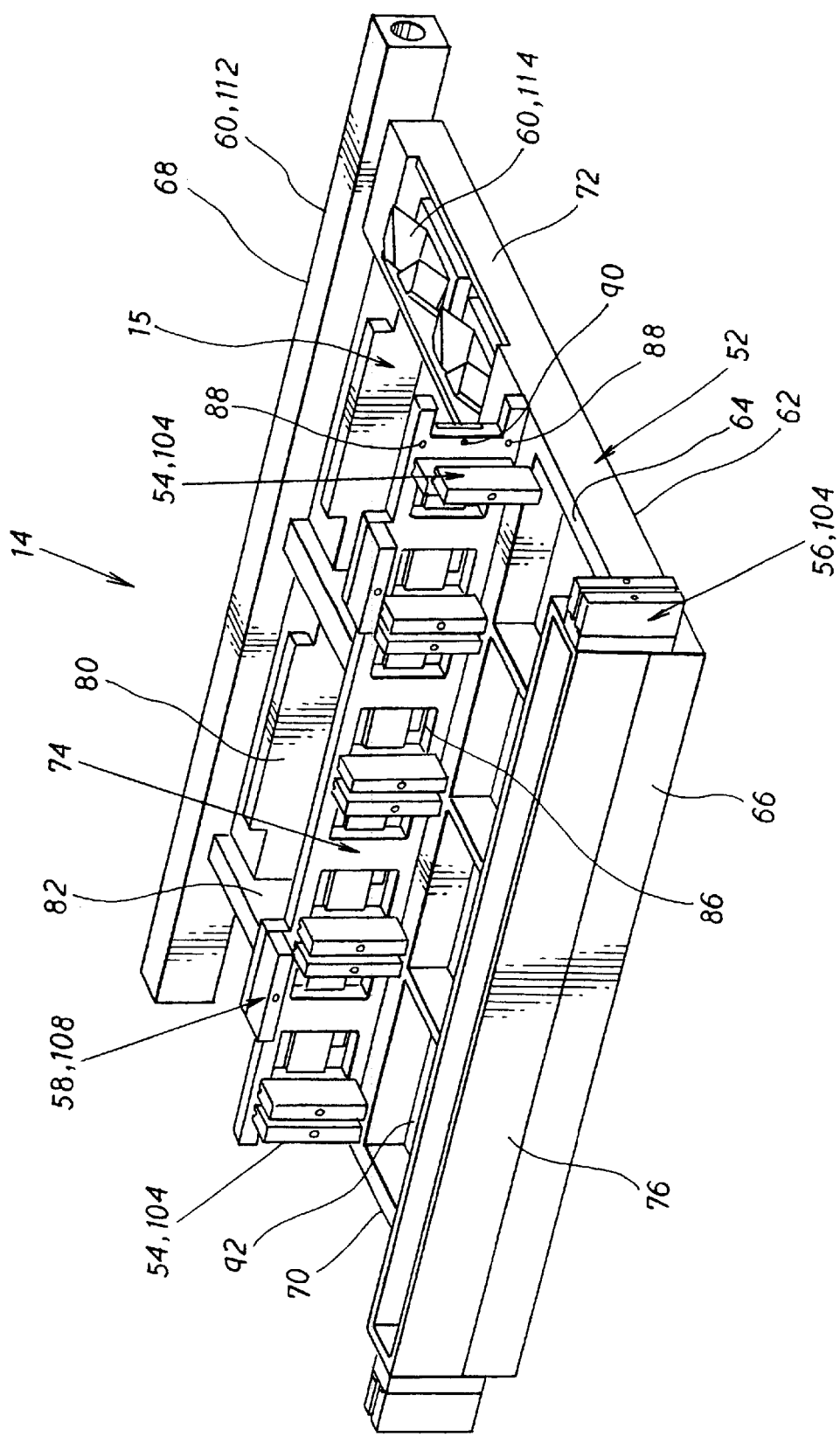
FIG. 5 is a top, partly exploded, perspective view of a fine stage having features of the present invention.
Figure 6:
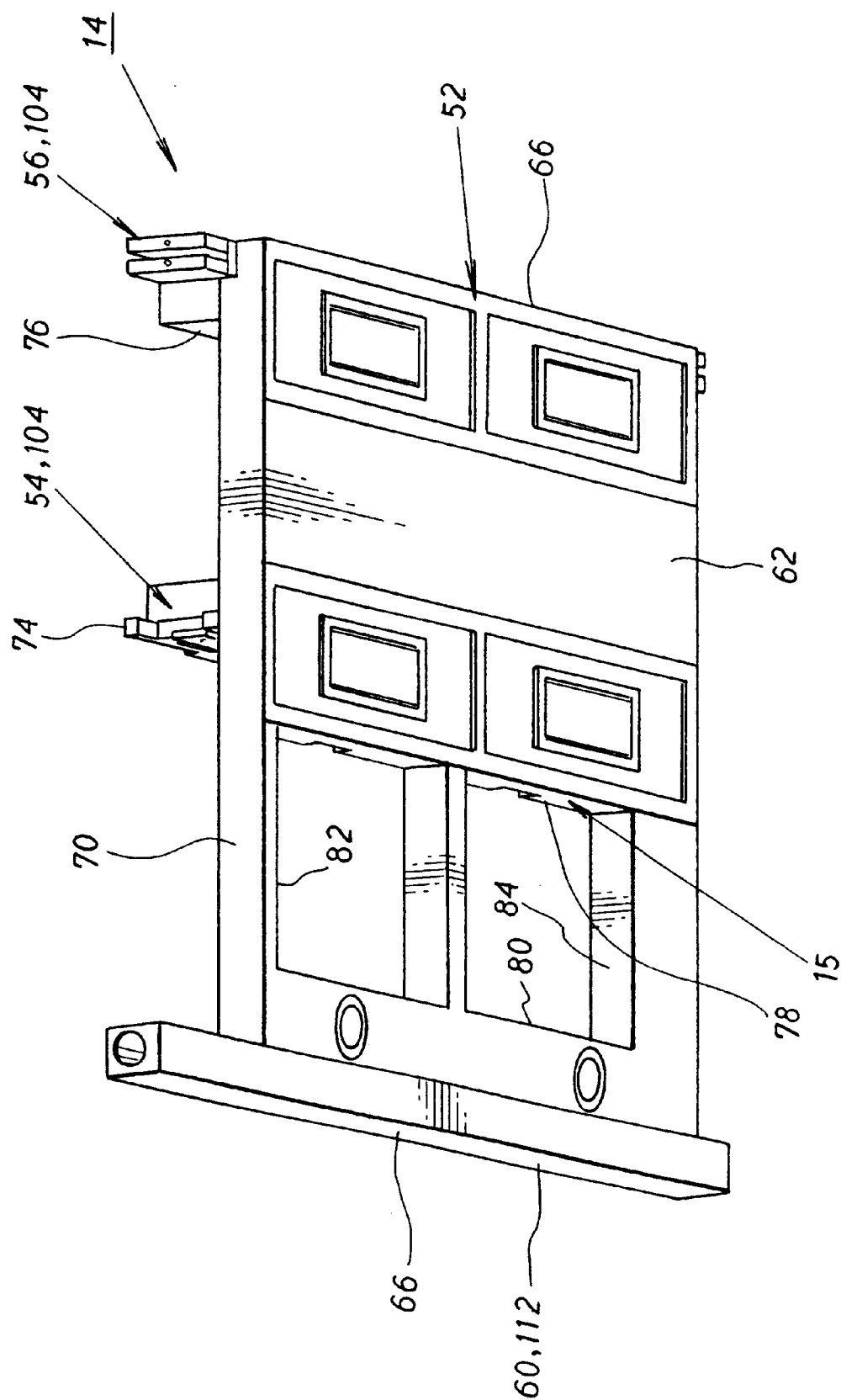
FIG. 6 is a bottom perspective view of the fine stage of FIG. 5.

The fine stage 14 precisely positions the one or more objects 24. The design of fine stage 14 and the degrees of freedom of the fine stage 14 relative to the stage base 12 can be varied. In the embodiment illustrated in the figures, the fine stage 14 is guideless and moved by the fine movers 32, 34 with a limited range of motion along the X axis, the Y axis and about the Z axis (theta Z) relative to the coarse stage 18. Referring to FIGS. 4–6, the fine stage 14 includes a fine frame 52, a first portion 54 of the fine Y mover 32, a first portion 56 of the fine X mover 34, a first portion 58 of the anti-gravity mechanism 40 and a first potion 60 of the measurement system 16.

Figure 9:
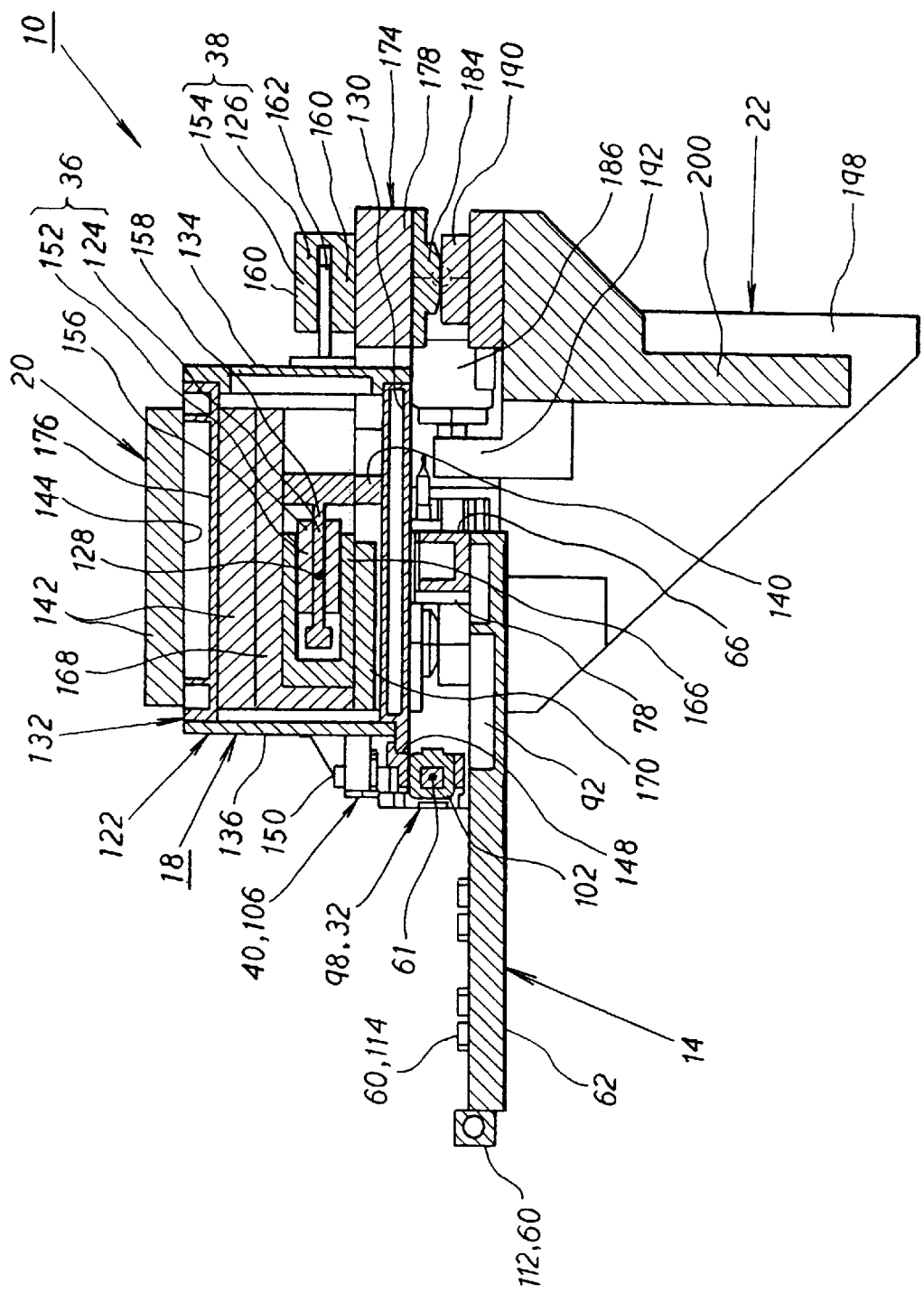
FIG. 9 is a cross-sectional view taken on line 9—9 of FIG. 3.
Figure 10:
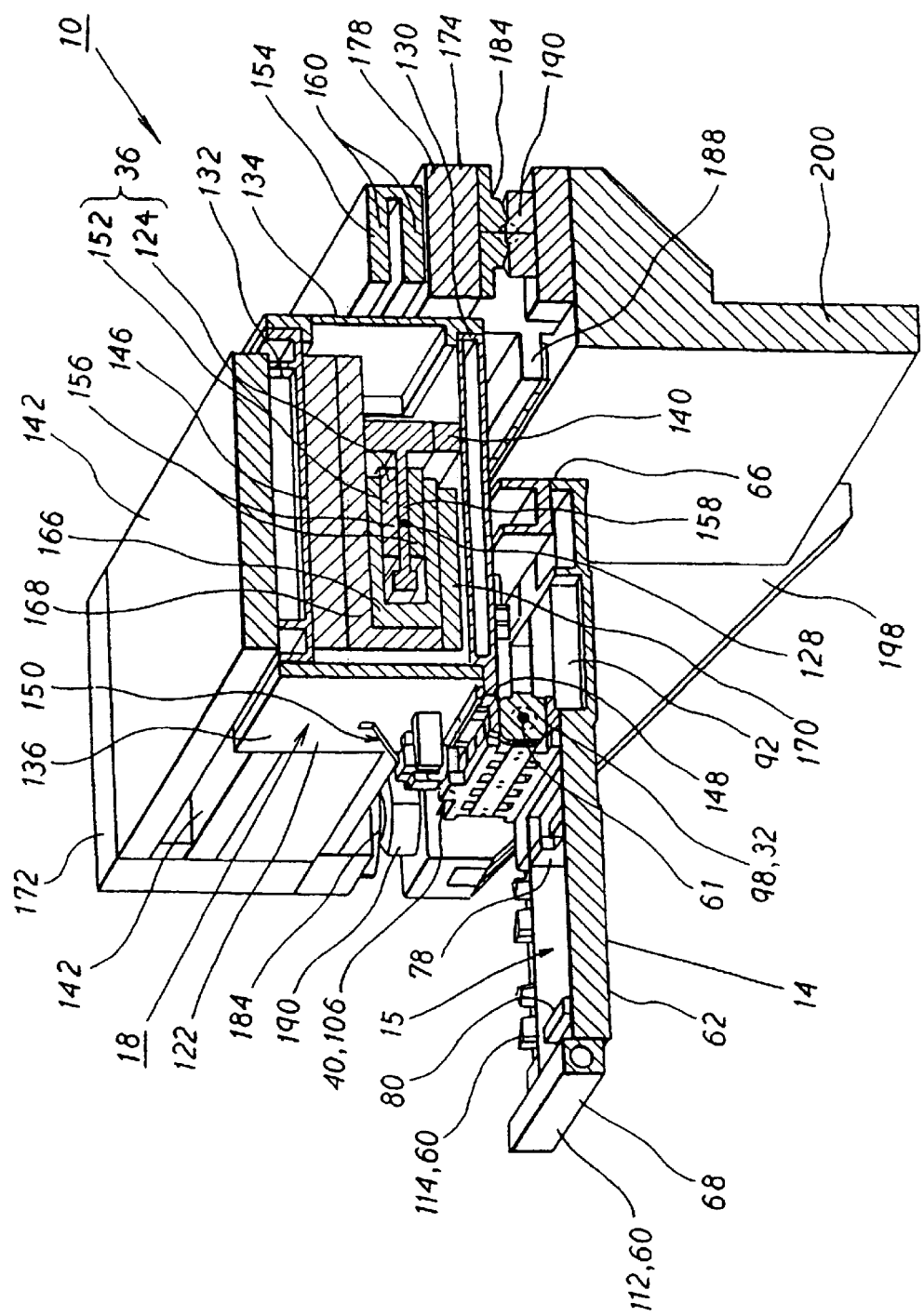
FIG. 10 is a perspective view of the view of FIG. 9.
Figure 11:
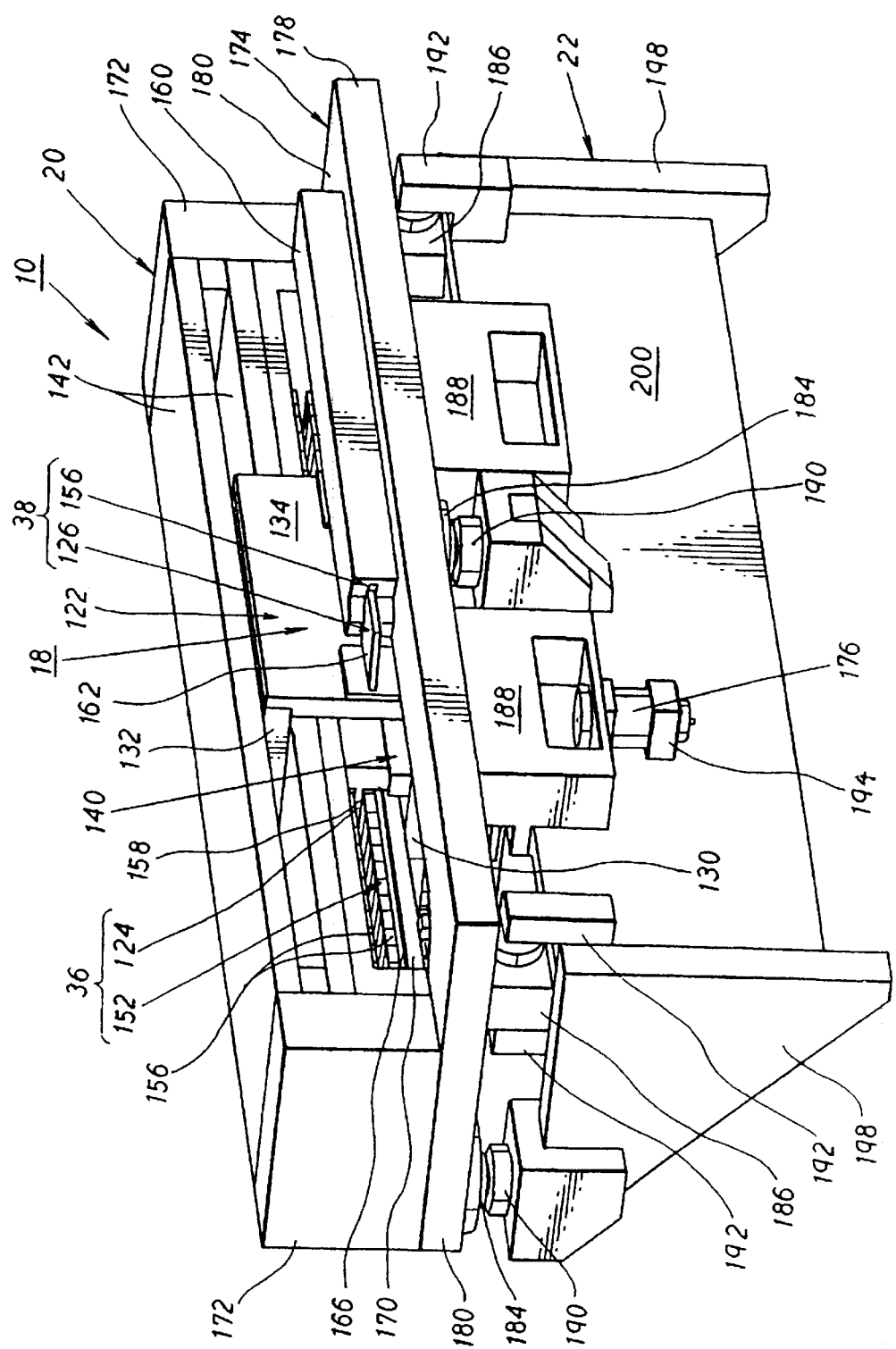
FIG. 11 is a side perspective view, in partial cut-away of the stage assembly of FIG. 1.
Figure 12:
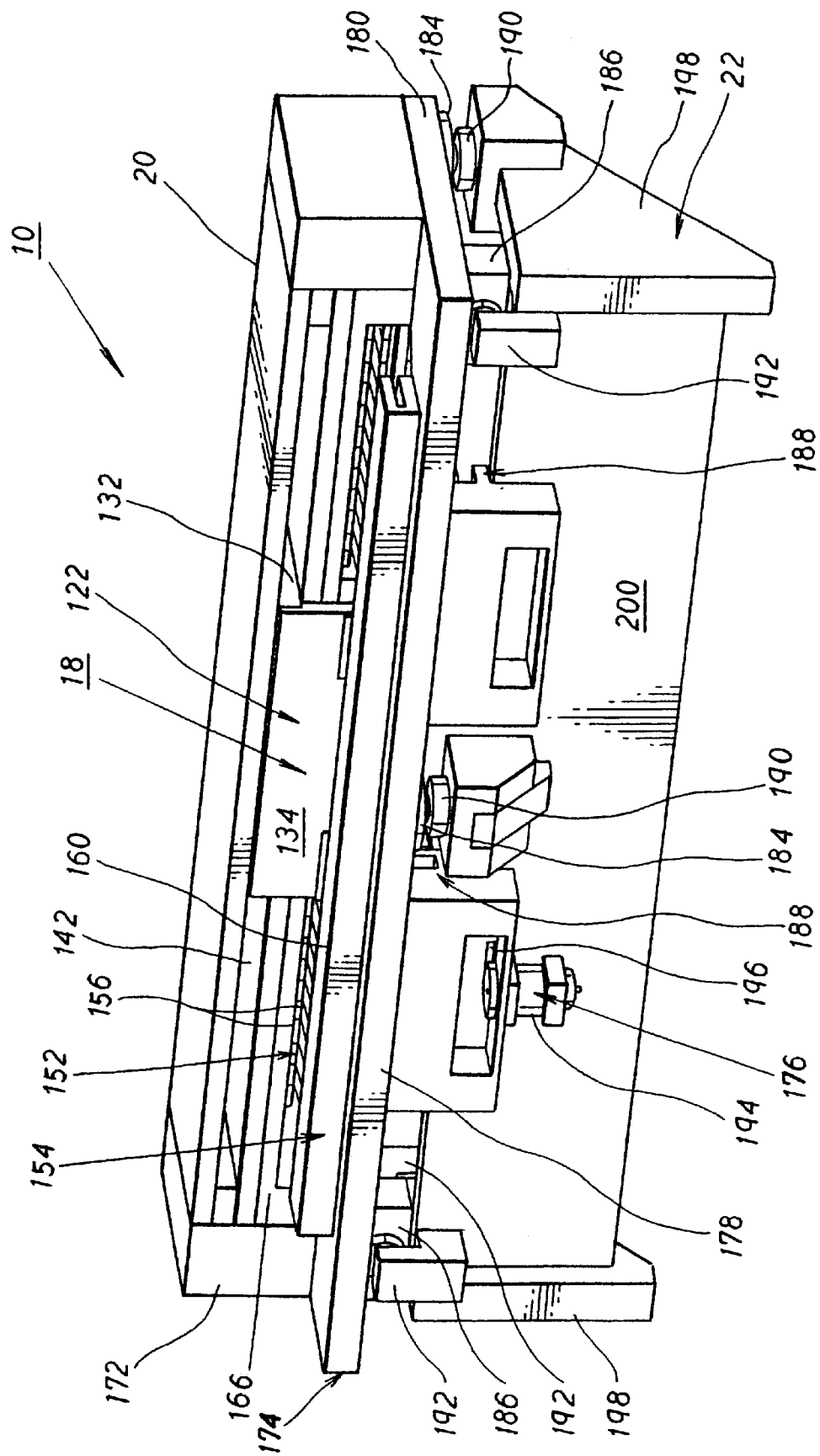
FIG. 12 is another side perspective view of the stage assembly of FIG. 1.

The combination of the fine stage 14 and the one or more objects 24 have a combined center of gravity 61 (illustrated as a dot in FIGS. 9 and 10). Importantly, the fine Y mover 32 engages the fine stage 14 near the combined center of gravity 61. This minimizes the coupling of acceleration of the fine Y mover 32 to movement along the X axis and about the Z axis of the fine stage 14. Stated another way, this minimizes the forces on the fine stage 14 along the X axis and about the Z axis, generated by the fine Y mover 32. With this design, the fine Y mover 32 does not tend to move the fine stage 14 along the X axis or rotate the fine stage 14 about the Z axis. As a result of this design, the force required to move the fine stage 14 along the X axis and about the Z axis is minimized. This allows for the use of a smaller and lighter, fine X mover 34.

The fine frame 52 is generally rectangular shaped and includes a fine frame bottom 62, a fine frame top 64, a first fine frame side 66, a second fine frame side 68 substantially opposite the first fine frame side 66, a front fine frame side 70 and a rear fine frame side 72 substantially opposite the front fine frame side 70. The fine frame 52 is preferably made of a ceramic material having a low rate of thermal expansion.

The fine frame bottom 62 includes a plurality of spaced apart fluid outlets (not shown) and a plurality of spaced apart fluid inlets (not shown). Pressurized fluid (not shown) is released from the fluid outlets towards the stage base 12 and a vacuum is pulled in the fluid inlets to create a vacuum preload type, fluid bearing between the fine frame 52 and the stage base 12. The vacuum preload type, fluid bearing maintains the fine stage 14 spaced apart along the Z axis relative to the stage base 12 and allows for motion of the fine stage 14 along the X axis, the Y axis and about the Z axis relative to the stage base 12. The vacuum preload fluid bearing maintains a high stiffness connection between the fine stage 14 and the stage base 12 along the Z axis, about the X axis and about the Y axis, despite the approximately zero net gravity force of the fine stage 14 as a result of the anti-gravity mechanism 40. Alternately, the fine stage 14 can be supported above the stage base 12 by alternate ways such as magnetic type bearing (not shown).

The fine frame 52 also includes one or more holders 15, a mid-wall 74 and a stiffener 76. Each holder 15 retains and secures one of the objects 24, e.g. reticles 26, to the fine stage 14. In the embodiment illustrated in the figures, each holder 15 is a rectangular shaped cut-out with vacuum chucks on either side. Each holder 15 includes a first holder side 78, an opposed second holder side 80, a front holder side 82 and a rear holder side 84. The number of holders 15 can be varied. For example, in the embodiment illustrated in the Figures, the fine stage 14 includes two spaced apart holders 15. Because of the unique design provided herein, a relatively low mass stage assembly 10 that retains two reticles 26 can be manufactured. Alternately, the fine stage 14 could include a single holder 15 for retaining only one reticle 26.

Importantly, as provided below, the required stroke of the coarse stage 18 along the Y axis will vary according to the number of objects 24 retained by the fine stage 14. More specifically, the stroke of the coarse stage 18 along the Y axis will need to be increased as the number of objects 24 is increased.

The mid-wall 74 extends upwardly from the fine frame top 64 and secures the first portion 54 of the fine Y mover 32 and the first portion 58 of the anti-gravity mechanism 40 to the fine frame 52. In the embodiment illustrated n the Figures, the mid-wall 74 is a flat, planar wall. The mid-wall 74 includes a plurality of spaced apart wall apertures 86 that extend transversely through the mid-wall 74. As illustrated in FIG. 5, the mid-wall 74 also includes a plurality of pairs of spaced apart pins 88 and a plurality of spaced apart internally threaded apertures 90 for securing the first portion 54 of the fine Y mover 32 and the first portion 58 of the anti-gravity mechanism 40 to the mid-wall 74.

The mid-wall 74 extends along the Y axis between the first fine frame side 66 and the first holder side 78. The mid-wall 74 is preferably extends near the combined center of gravity 61 so that the fine Y mover 32 is maintained near the combined center of gravity 61. In the embodiments provided herein, the combined center of gravity 61 is near the mid-wall 74 approximately half way between the front fine frame side 70 and the rear fine frame side 72. With this design, the force from the fine Y mover 32 is directed through the combined center of gravity 61.

The stiffener 76 provides stiffness to the fine stage 14 and inhibits bending and flexing of the fine stage 14. Additionally, the stiffener 76 adds mass to the fine stage 14 so that the combined center of gravity 61 is near the mid-wall 74. The design and location of the stiffener 76 can be varied to suit the design of the fine stage 14. In the embodiment illustrated in the Figures, the stiffener 76 is rectangular "U" shaped and extends along the first fine frame side 66. The first portion 56 of the fine X mover 34 is secured to the stiffener 76 near the front fine frame side 70 and the rear fine frame side 72.

Preferably, the fine stage 14 includes one or more stage openings 92 that are strategically positioned to lighten the mass of the fine stage 14 and balance the mass of the fine stage 14, without compromising the structural strength of the fine stage 14. The number and design of the stage openings 92 can be varied. In the embodiment illustrated in the Figures, the fine stage 14 includes four, rectangular shaped stage openings 92 that extend partly into the fine frame top 64. The stage openings 92 are located between the mid-wall 74 and the first fine frame side 66 of the fine frame 52.

As provided above, the fine movers 32, 34 move the fine stage 14 with a limited range of motion along the X axis, the Y axis and about the Z axis relative to the coarse stage 18. More specifically, the fine Y mover 32 moves the fine stage 14 relative to the coarse stage 18 along the Y axis and the fine X mover 34 moves the fine stage 14 relative to the coarse stage 18 along the X axis and around the theta Z axis.

The design of each fine movers 32, 34 can be varied to suit the design requirements of the stage assembly 10. In the embodiment illustrated in the Figures, each fine Y mover 32 includes the first portion 54 that is secured to the fine stage 14 and a second portion 94 that is secured to the coarse stage 18. The first portion 54 and the second portion 94 of the fine Y mover 32 interact to selectively move the fine stage 14 along the Y axis.

Somewhat similarly, each fine X mover 34 includes the first portion 56 that is secured to the fine stage 14 and a second portion 96 that is secured to the coarse stage 18. The first portion 56 and the second portion 96 of the fine X mover 34 interact to selectively move the fine stage 14 along the X axis and about the Z axis.

In the embodiment illustrated in the Figures, the fine Y mover 32 and the fine X mover 34 each include a plurality of spaced apart pairs of opposed, attraction only actuators 98. More specifically, the fine Y mover 32 includes five, spaced apart pairs of opposed, attraction only actuators 98 and the fine X mover 34 includes two, spaced apart pairs of opposed, attraction only actuators 98.

The attraction only type actuators 98 consume less power and generate less heat than a voice coil motor or a linear motor. This minimizes the need to cool the fine movers 32, 34. Further, because the fine movers 32, 34 are each located on only on side of the holder 15, any heat from the fine movers 32, 34 can be easily directed away from the measurement system 16.

Figure 7:
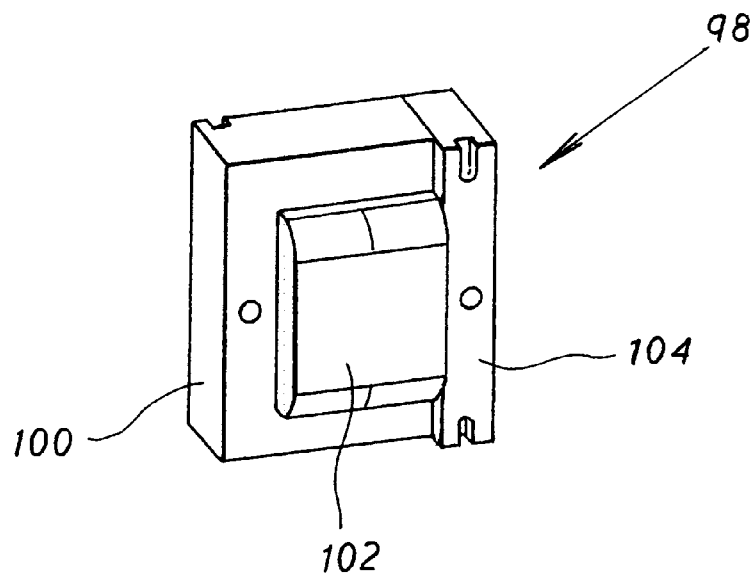
FIG. 7 is a perspective view of a mover having features of the present invention.
Figure 8:
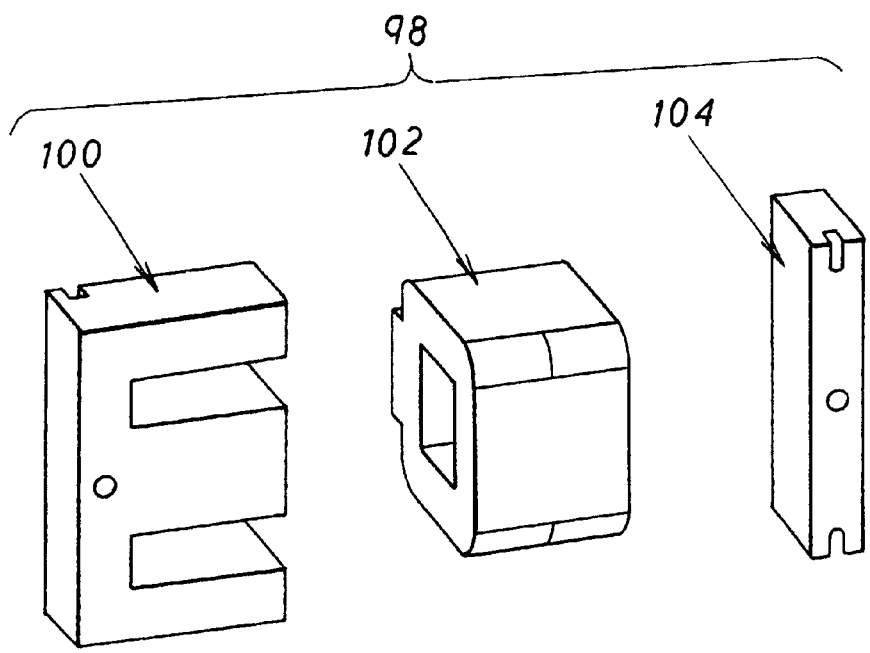
FIG. 8 is an exploded perspective view of the mover of FIG. 7.

FIGS. 7 and 8 illustrate a perspective view of a preferred attraction only actuator 98. More specifically, FIG. 7 illustrates a perspective view of a type of attraction only actuator 98 commonly referred to as an E/I core actuator and FIG. 8 illustrates an exploded perspective view of the E/I core actuator. Each E/I core actuator is essentially an electomagnetic attractive device. Each E/I core actuator includes an E shaped core 100, a tubular coil 102, and an I shaped core 104. The E core 100 and the I core 104 are each made of a magnetic material such as iron. The coil 102 is positioned around the center bar of the E core 100. Current (not shown) directed through the coil 102 creates an electromagnetic field that attracts the I core 104 towards the E core 100. The amount of current determines the amount of attraction.

In the embodiments provided herein, (i) the I core 104 of each attraction only actuator 98 is considered the first portion 54, 56 of each fine mover 32, 34 and is secured to the fine stage 14, and (ii) the E core 100 and coil 102 of each attraction only actuator 98 is considered the second portion 94, 96 of each fine mover 32, 34 and is secured to the coarse stage 18.

Specifically, the fine Y mover 32 includes five pairs of spaced apart, I cores 104 (ten total I cores) secured to the mid-wall 74 and five pairs of spaced apart, E cores 100 and coils 102 (ten total E cores and ten coils 102) secured to the coarse stage 18. The fine Y mover 32 is preferably centered on the combined center of gravity 61.

Somewhat similarly, the fine X mover 34 includes two sets of two spaced apart, I cores 104 (four total I cores) and two sets of two spaced apart, E cores 100 and coils 102 (four total E cores 100 and coils 102). One of the sets of I cores 104 is secured to each end of the stiffener 76 and the two sets of E cores 100 and coils 102 are secured to the coarse stage 18.

This arrangement is preferred because no electrical wires associated with the fine movers 32, 34 are directly connected to the fine stage 14. This reduces interference to the fine stage 14. Alternately, the mounting of the attraction only actuators 98 could be reversed. In this proposed configuration, the I cores 104 would be attached to the coarse stage 18 while the E cores 100 and coils 102 would be secured to the fine stage 14.

The anti-gravity mechanism 40 offsets the weight of the fine stage 14 and minimizes distortion of the stage base 12 as the fine stage 14 moves relative to the stage base 14. More specifically, the anti-gravity mechanism 40 pulls upward on the fine stage 14 as the fine stage 14 moves relative to the stage base 12 to inhibit the location of the fine stage 14 from influencing the stage base 12.

In the embodiment illustrated in the Figures, the anti-gravity mechanism 40 includes a pair of spaced apart attraction only actuators 106. Each attraction only actuator 106 includes the first portion 58 that is secured to the top of the mid-wall 74 and a second portion 108 that is secured to the coarse stage 18.

Preferably, each attraction only actuator 106 is an E/I core actuator as described above. With this design, two spaced apart I cores 104 are secured to the top of the mid-wall 74 and two spaced apart E cores 100 and coils 102 are secured to the coarse stage 18. Alternately, the mounting of the I core 104 and the E core 100 can be reversed.

Importantly, the anti-gravity mechanism 40 is also positioned near the combined center of gravity 61 and the fine Y mover 32 so that the anti-gravity mechanism 40 can lift the fine stage 14 along the Z axis to counteract the influence of fine stage 14 on the stage base 12. Further, the amount of attraction generated by the anti-gravity mechanism 40 can be adjusted by adjusting the current to the coil 102.

The measurement system 16 monitors the position of the fine stage 14 relative to the stage base 12. With this information, the position of the fine stage 14 can be adjusted. The design of the measurement system 16 can be varied. In the embodiment illustrated in FIG. 1, the measurement system 16 includes the first portion 60 that is part of and mounted to the fine stage 14 and a second portion 110.

Referring to FIG. 1, the first portion 60 of the measurement system 16 includes a X interferometer mirror 112 and a pair of spaced apart Y interferometer mirrors 114 while the second portion 110 includes a X interferometer block 116 and a Y interferometer block 118. Alternately, these components can be reversed.

The X interferometer block 116 interacts with the X interferometer mirror 112 to monitor the location of the fine stage 14 along the X axis. More specifically, the X interferometer block 116 generates a measurement signal (not shown) that is reflected off of the X interferometer mirror 112. With this information, the location of the fine stage 14 along the X axis can be monitored. In the embodiment illustrated in the Figures, the X interferometer mirror 112 is rectangular shaped and extends along the second fine frame side 68 of the fine frame 52. The X interferometer block 116 is positioned away from the fine stage 14. The X interferometer block 116 can be secured to an apparatus frame 120 (illustrated in FIG. 13) or some other location that is isolated by vibration.

The Y interferometer mirrors 114 interact with the Y interferometer block 118 to monitor the position of the fine stage 14 along the Y axis and about the Z axis (theta Z). More specifically, the Y interferometer block 118 generates a pair of spaced apart measurement signals (not shown) that are reflected off of the Y interferometer mirrors 114. With this information, the location of the fine stage 14 along the Y axis and about the Z axis can be monitored. In the embodiment illustrated in the Figures, each Y interferometer mirror 114 is somewhat "V" shaped and is positioned along the rear fine frame side 72 of the fine frame 52. The Y interferometer block 118 is positioned away from the fine stage 14. The Y interferometer block 118 can be secured to an apparatus frame 120 or some other location that is isolated from vibration.

Importantly, because the fine movers 32, 34 and the coarse movers 36, 38 are positioned on only one side of the holder 15, the measurement system 16 can be easily positioned near the fine stage 14.

The coarse stage 18 keeps the second portion of the fine Y mover 94 and the second portion of the fine X mover 96 near the fine stage 14 over the long stroke. This allows for the use of relatively short travel, efficient fine Y mover 32 and fine X mover 34.

The design of coarse stage 18 and the degrees of freedom of the coarse stage 18 relative to the reaction assembly 20 can be varied. In the embodiment illustrated in the figures, the coarse stage 18 is guideless in the planar degrees of freedom and is moved by the coarse movers 36, 38 a relatively long displacement along the Y axis and a relatively short displacement along the X axis and around the Z axis (theta Z). More specifically, the coarse stage 18 illustrated in the Figures is moved by the coarse Y mover 36 relative to the reaction assembly 20 a relatively long displacement along the Y axis. Further, the coarse stage 18 is moved by the coarse X mover 38 a relatively short displacement along the X axis and around the Z axis (theta Z).

Further, in the embodiments illustrated in the Figures, the coarse stage 18 is positioned above the fine stage 14.

Referring to FIGS. 4, and 9–12, the coarse stage 18 includes a coarse frame 122, the second portion 94 of the fine Y mover 32, the second portion 96 of the fine X mover 34, the second portion 108 of the anti-gravity mechanism 40, a first portion 124 of the coarse Y mover 36, and a first portion 126 of the coarse X mover 38.

The combination of the fine stage 14, the objects 24 and the coarse stage 18 have a combination center of gravity 128 (illustrated as a dot in FIGS. 9 and 10). Importantly, the coarse Y mover 36 engages the coarse stage 18 near the combination center of gravity 128. This minimizes the coupling of acceleration of the coarse Y mover 36 to movement along the X axis and about the Z axis of the coarse stage 18. Stated another way, this minimizes the forces on the coarse stage 18 along the X axis and about the Z axis, generated by the coarse Y mover 36. With this design, the coarse Y mover 36 does not tend to move the coarse stage 18 along the X axis or rotate the coarse stage 18 about the Z axis. As a result of this design, the force required to move the coarse stage 18 along the X axis and about the Z axis is minimized. This allows for the use of a smaller, lighter mass, coarse X mover 38.

The coarse frame 122 illustrated in the Figures is generally rectangular tube shaped and includes a coarse frame bottom 130, a coarse frame top 132, a first coarse frame side 134 and a second coarse frame side 136 substantially opposite the first coarse frame side 134. The coarse frame 122 can be made of a number of materials, including a ceramic material or aluminum.

The coarse frame bottom 130 supports the second portion 96 of the fine X mover 34 and the first portion 124 of the coarse Y mover 36. More specifically, a pair of attachment plates 138 cantilever downward from coarse frame bottom 130 intermediate the coarse frame sides 134, 136. One of the attachment plates 138 is positioned on the front of the coarse stage 18 while the other attachment plate 138 is positioned on the rear of the coarse stage 18. The second portion 96 of the fine X mover 34 (e.g., a pair of E cores 100 and a pair of coils 102) is attached to each attachment plate 138.

The first portion 124 of the coarse Y mover 36 is secured to the coarse frame bottom 130 and extends along the length of the coarse stage bottom 130 between the front and rear of the coarse stage 18. In the embodiment illustrated in the Figures, a rectangular shaped, attachment bar 140 is positioned between and used to secure the first portion 124 of the coarse Y mover 36 to the coarse frame bottom 130. The attachment bar 140 is secured to the first portion 124 of the coarse Y mover 36 and the coarse frame bottom 130 with an attachment bolt (not shown).

In the embodiment provided herein, the combination center of gravity 128 is near the center of the first portion 124 of the coarse Y mover 36 approximately half way between the front and the rear of the coarse stage 18.

In the embodiments provided herein, the coarse frame top 132 is supported between a pair of spaced apart bearing plates 142 of the reaction assembly 20. The coarse frame top 132 is generally planar shaped and includes an upper surface 144 and a lower surface 146. The upper surface 144 and the lower surface 146 of the coarse frame top 132 each include a plurality of spaced apart fluid outlets (not shown). Pressurized fluid (not shown) is released from the fluid outlets towards the bearing plates 142 of the reaction assembly 20 to create a fluid bearing between the coarse frame top 132 and the bearing plates 142. The fluid bearing maintains the coarse frame top 132 spaced between the bearing plates 142 and allows for relatively large movement of the coarse stage 18 relative to the reaction assembly 20 along the Y axis, and smaller movement along the X axis and about the Z axis relative to the reaction assembly 20. Alternately, the coarse stage 18 can be supported by the reaction assembly 20 by other ways such as magnetic type bearing (not shown). In another alternate embodiment, the coarse stage 18 can be supported by the reaction assembly 20 having only one bearing plate with a vacuum preload type fluid bearing (not shown).

The first coarse frame side 134 extends between coarse frame bottom 130 and the coarse frame top 132 and secures the first portion 126 of the coarse X mover 34 to the coarse stage 18. In the embodiment illustrated in the Figures, the first portion 126 is positioned intermediate the coarse frame bottom 130 and the coarse frame top 132.

The second coarse frame side 136 extends between coarse frame bottom 130 and the coarse frame top 132 and secures the second portion 94 of the fine Y mover 32 and the second portion 108 of the anti-gravity mechanism 40 to the coarse stage 18. More specifically, a side attachment plate 148 cantilevers downward from the second coarse frame side 136 and a pair of spaced apart, three beam assemblies 150 extend transversely from the second coarse frame side 136. The second portion 94 of the fine Y mover 32 (e.g., ten spaced apart E cores 100 and ten coils 102) is secured to the side attachment plate 148. The second portion 108 of the anti-gravity mechanism 40 (e.g., two spaced apart E cores 100 and two coils 102) is retained by the three beam assemblies 150 to the second coarse frame side 136.

The design of each coarse movers 36, 38 can be varied to suit the design requirements of the stage assembly 10. In the embodiment illustrated in the Figures, each coarse Y mover 36 includes the first portion 124 that is secured to the coarse stage 18 and a second portion 152 that is secured to the reaction assembly 20. The first portion 124 and the second portion 152 of the coarse Y mover 36 interact to selectively move the coarse stage 18 along the Y axis. Somewhat similarly, each coarse X mover 38 includes two of the first portion 126 that is secured to the coarse stage 18 and a second portion 154 that is secured to the reaction assembly 20. The first portions 126 and the second portion 154 of the coarse X mover 38 interact to selectively move the coarse stage 18 along the X axis and about the Z axis.

In the embodiment illustrated in the Figures, the coarse Y mover 36 is a linear motor. In this embodiment, the first portion 124 of the coarse Y mover 36 includes a plurality of spaced apart coils (not shown) aligned in a coil array (not shown) while the second portion 152 of the coarse Y mover 36 includes a pair of spaced apart Y magnet arrays 156. Each Y magnet array 156 is positioned on one of the sides of the coil array. The coil array extends the length of the coarse frame 122 and is disposed within a generally "T" shaped Y coil frame 158 that also extends the length of the coarse frame 122. The Y magnet arrays 156 extend substantially parallel along the length of the bearing plates 142 and are retained by the reaction assembly 20. Alternately, the configuration of the coil array and the magnet array can be reversed.

It should be noted that the coarse Y mover 36 is designed to allow for movement along the X axis and about the Z axis.

Referring to FIG. 9, each Y magnet array 156 is sized to provide space for the Y coil frame 156 along the X axis and about the Z axis.

The desired stroke of the coarse Y mover 36 along the Y axis will vary according to the number of objects 24 retained by the fine stage 14. More specifically, the stroke of the coarse Y mover along the Y axis will need to be increased as the number of objects 24 is increased. A suitable stroke of a single reticle 26 is between approximately 250 millimeters and 350 millimeters while a suitable stroke for two reticles 26 is between approximately 450 millimeters and 550 millimeters.

Importantly, the coarse Y mover 36 engages the coarse stage 18 near the combination center of gravity 128. As a result of this design, the force required to move the coarse stage 18 along the X axis and about the Z axis is minimized. This allows for the use of a smaller, lighter mass, coarse X mover 38.

In the embodiment illustrated in the Figures, the coarse X mover 38 includes a pair of spaced apart voice coil actuators. In this embodiment, the first portion 126 of the coarse X mover 38 includes a pair of spaced apart coils (not shown) and the second portion 154 of the coarse X mover 38 includes a pair of X magnet arrays 160. Each coil is disposed within a generally "T" shaped X coil frame 162. The X magnet arrays 160 extend substantially parallel along the length of the reaction assembly 20 and are retained by the reaction assembly 20. Alternately, the configuration of the coil array and the magnet array can be reversed.

The reaction assembly 20 reduces and minimizes the amount of reaction forces from the coarse movers 36, 38 that is transferred through the mounting frame 22 to the ground 164. The reaction assembly 20 is supported above the mounting frame 22 by a fluid bearings as provided below. Through the principle of conservation of momentum, movement of the coarse stage 18 with the coarse Y mover 36 in one direction, moves the reaction assembly 20 in the opposite direction along the Y axis. The reaction forces along the X axis and about the Z axis from the coarse X mover 38 are relatively small and are transferred directly to the mounting plate 174 through the second portion of the coarse X mover 154.

The design of the reaction assembly 20 can be varied to suit the design requirements of the stage assembly 10. In the embodiment illustrated in the Figures, the reaction assembly 20 includes the pair of spaced apart bearing plates 142, a "U" shaped bracket 166, a "L" shaped bracket 168, a bottom plate 170, a pair of end blocks 172, a mounting plate 174 and a trim mover 76. The bearing plates 142, the "U" shaped bracket 166, the "L" shaped bracket 168, and the bottom plate 170 each extend between and are supported by the end blocks 172. The end blocks 172 are mounted to the mounting plate 174.

As provided above, the bearing plates 142 provide a fluid bearing surface for supporting the coarse stage 18. The "U" shaped bracket 166 supports the second portion 152 of the coarse Y mover 36. More specifically, the "U" shaped bracket 166 supports the pair of Y magnets arrays 156 on each side of the first portion 124 of the coarse Y mover 36. The "L" shaped bracket 168 and the bottom plate 170 support the "U" shaped bracket 166 and secure the "U" shaped bracket 166 to the lower bearing plate 142. The "L" shaped bracket 168 can include a passageway for directing a circulating fluid (not shown) for cooling the coarse Y mover 36.

The mounting plate 174 is generally planar shaped and includes a body section 178 and a pair of spaced apart transverse sections 180. The second portion 154 of the coarse X mover 38 (i.e. the X magnet arrays 160) is secured to the top of the body section 178 and each end block 172 is attached to the top of each of the transverse sections 180. The mounting plate 174 also includes (i) three, spaced apart, upper Z bearing components 184, (ii) two, spaced apart, upper X bearing components 186, and (iii) two, space apart, preload magnets 188.

Two of the upper Z bearing components 184 extends downward from the bottom of each transverse section 180 and the other upper Z bearing component 184 extends downward from the bottom of the body section 178. The upper Z bearing components 184 interact with three, spaced apart lower Z bearing components 190 that are secured to the mounting frame 22. More specifically, pressurized fluid is released between the corresponding Z bearing components 184, 190 to create a fluid bearing that maintains the reaction assembly 20 spaced apart from the mounting frame 22 along the Z axis. The fluid bearing also allows for relative motion between the reaction assembly 20 and the mounting frame 22 so that reaction forces from the coarse movers 36, 38 are not transferred to the mounting frame 22 and the ground 164. Alternately, the reaction assembly 20 can be supported above the mounting frame 22 by other ways such as magnetic type bearing (not shown).

The upper X bearing components 186 extend downward from the bottom of the body section 178. Each upper X bearing component 186 is positioned between a pair of spaced apart lower X bearing components 192 that are secured to the mounting frame 22. Pressurized fluid is released from the lower X bearing components 192 against the upper X bearing component 186 to create a fluid bearing that maintains the reaction assembly 20 properly spaced relative to the mounting frame 22 along the X axis. The fluid bearing also allows for relative motion between the reaction assembly 20 and the mounting frame 22 so that reaction forces from the coarse movers 36, 38 are not transferred to the mounting frame 22 and the ground 164. Alternately, the reaction assembly 20 can be supported above the mounting frame 22 along the X axis by other ways such as magnetic type bearing (not shown).

The spaced apart preload magnets 188 extend downward from the bottom of the body section 178. The preload magnets 188 are attracted to mounting frame 22 and urge the reaction assembly 20 towards the mounting frame 22. This loads the fluid bearing created between the corresponding Z bearing components 184, 190. Alternately, for example, a vacuum could be created between the reaction assembly 20 and the mounting frame 22 to load the fluid bearing.

The trim mover 176 is used to make minor corrections along the Y axis to the position of the reaction assembly 20 relative to the mounting frame 22. The design of the trim mover 176 can be varied. For example, the trim mover 176 can be a rotary motor, a voice coil motor or a linear motor. In the embodiment illustrated in the Figures, the trim mover 176 is a rotary motor connected to both the reaction assembly 20 and the mounting frame 22.

The trim mover 176 includes a body 194 and a tab 196 that is moved by rotation of the motor. The body 194 of the trim mover 176 is mounted to one of the preload magnets 188 of the reaction assembly 20 and the tab 196 is mounted to the mounting frame 22. With this design, rotation of the trim mover 176 can move the tab 196 and make minor corrections along the Y axis to the position of the reaction assembly 20 relative to the mounting frame 22. Preferably, the trim mover 176 includes an encoder (not shown) that provides information regarding the position of the reaction assembly 20 relative to the mounting frame 22 along the Y axis.

Preferably, the mass ratio of the reaction assembly 20 to the combination fine stage 14 and coarse stage 18 is high. This will minimize the movement of the reaction assembly and minimize the required travel of the trim mover 176.

The mounting frame 22 is rigid and supports the reaction assembly 20 above the ground 164. The design of the mounting frame 22 can be varied to suit the design requirements of the stage assembly 10 and the exposure apparatus 28. In the embodiment illustrated in the Figures, the mounting frame 22 includes a pair of side brackets 198 that are maintained apart by a back bracket 200. One of the lower Z bearing components 190 is secured to each of the side brackets198 and the other lower Z bearing component 190 is secured to the back bracket 200. The two pairs of spaced apart lower X bearing components 192 are also secured to the back bracket 200.

Figure 13:
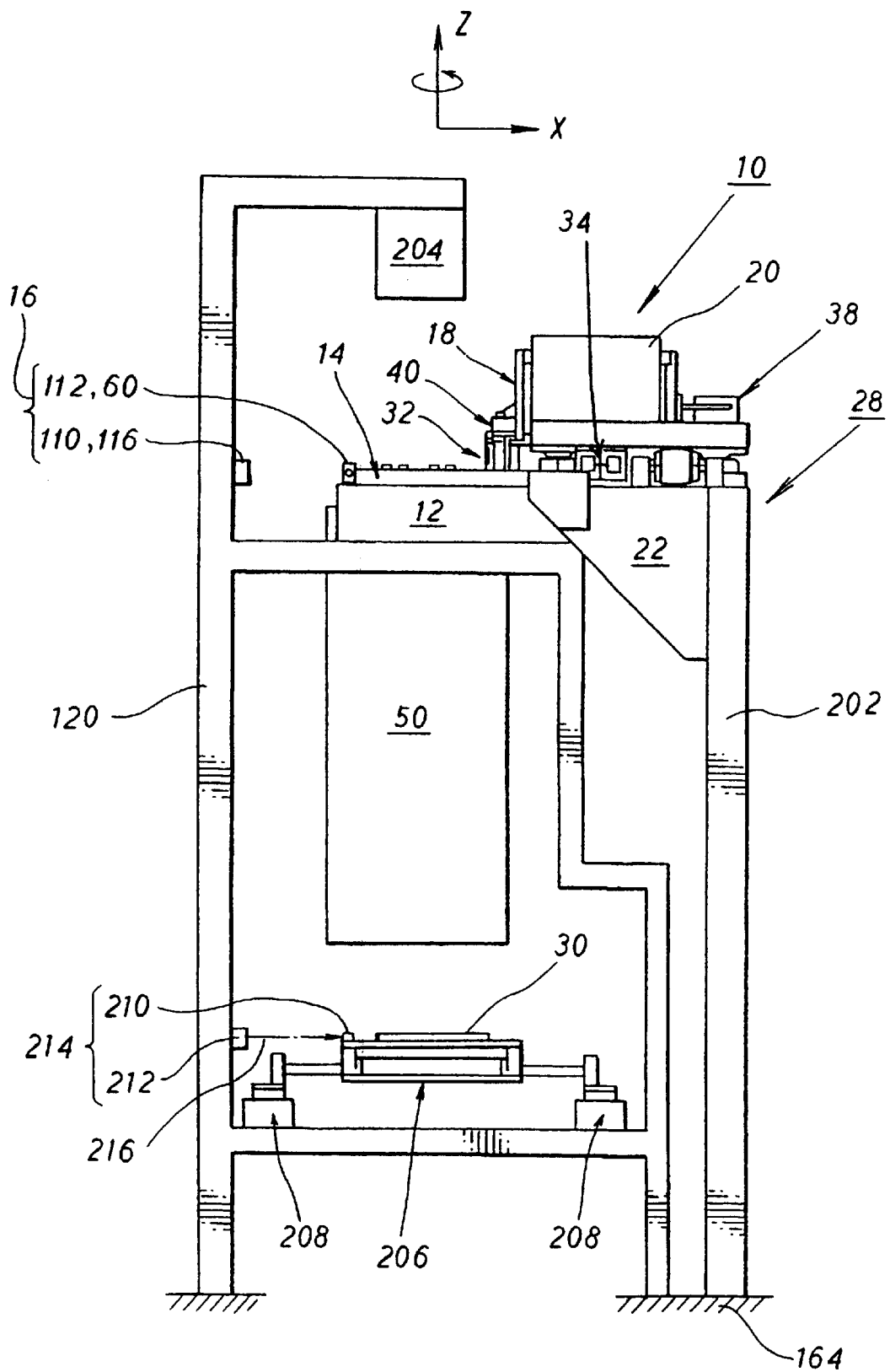
FIG. 13 is an illustration of an exposure apparatus having features of the present invention.

The mounting frame 22 can be secured to the ground 164 in a number of alternate ways. For example, as illustrated in FIG. 13, the mounting frame 22 can be secured with a separate reaction frame 202 to the ground 164. Alternately, because of the use of the reaction assembly 20, the mounting frame 22 can be secured to the apparatus frame 120 with some of the other components of the exposure apparatus 28.

FIG. 13 is a schematic view illustrating an exposure apparatus 28 useful with the present invention. The exposure apparatus 28 includes an apparatus frame 120, an illumination or irradiation system 204, the reticle stage assembly 10, the lens assembly 50, and a wafer stage 206.

The exposure apparatus 28 is particularly useful as a lithographic device which transfers a pattern (not shown) of an integrated circuit from the reticle 26 onto the semiconductor wafer 30. The exposure apparatus 28 mounts to the ground 164, i.e., a floor, a base or some other supporting structure.

The apparatus frame 120 is rigid and supports the components of the exposure apparatus 28. The design of the apparatus frame 120 can be varied to suit the design requirements for the rest of the exposure apparatus 28. The apparatus frame 120 illustrated in FIG. 13, supports the stage base 12, the wafer stage 206, the lens assembly 50, and the illumination system 204 above the ground 164. Alternately, for example, separate, individual structures (not shown) can be used to support the wafer stage 206, the illumination system 204 and the lens assembly 50 above the ground 164. The illumination system 204 includes an illumination source and an illumination optical assembly. The illumination source emits the beam of light energy. The illumination optical assembly guides the beam of light energy from the illumination source to the lens assembly 50. The beam illuminates selectively different portions of the reticle 26 and exposes the wafer 30. In FIG. 13, the illumination system 204 is illustrated as being supported above the reticle stage assembly 10. Typically, however, the illumination system 204 is secured to one of the sides of the apparatus frame 120 and the energy beam from the illumination system 204 is directed to above the reticle stage assembly 10.

The lens assembly 50 projects and/or focuses the light passing through reticle 26 to the wafer 30. Depending upon the design of the apparatus 28, the lens assembly 50 can magnify or reduce the image illuminated on the reticle 26.

The reticle stage assembly 10 holds and positions the reticle 26 relative to the lens assembly 50 and the wafer 30. Similarly, the wafer stage 206 holds and positions the wafer 30 with respect to the projected image of the illuminated portions of the reticle 26. In FIG. 13, the wafer stage 206 is positioned by linear motors 208. Depending upon the design, the apparatus 28 can also include additional motors to move the wafer stage 206. In this embodiment, the position of the wafer stage 206 is monitored by an interferometer system 214. The interferometer system 214 comprises a moving mirror 210 disposed on the top surface of the wafer stage 206 and a wafer interferometer 212 connected to the apparatus frame 120. The wafer interferometer 212 generates a measurement beam 216 toward the moving mirror 210, and detects the beam reflected from the moving mirror 210. The linear motors 208 drive the wafer stage 206 based on the result of the monitoring of the interferometer system 214.

There are a number of different types of lithographic devices. For example, the exposure apparatus 28 can be used as scanning type photolithography system that exposes the pattern from the reticle 26 onto the wafer 30, with the reticle 26 and wafer 30 moving synchronously. In a scanning type lithographic device, the reticle 26 is moved perpendicular to an optical axis of the lens assembly 50 by the reticle stage assembly 10 and the wafer 30 is moved perpendicular to the optical axis of the lens assembly 50 by the wafer stage 206. Scanning of the reticle 26 and the wafer 30 occurs while the reticle 26 and the wafer 30 are moving synchronously.

Alternately, the exposure apparatus 28 can be a step-and-repeat type photolithography system that exposes the reticle 26 while the reticle 26 and the wafer 30 are stationary. In the step and repeat process, the wafer 30 is in a constant position relative to the reticle 26 and the lens assembly 50 during the exposure of an individual field. Subsequently, between consecutive exposure steps, the wafer 30 is consecutively moved by the wafer stage 206 perpendicular to the optical axis of the lens assembly 50 so that the next field of the wafer 30 is brought into position relative to the lens assembly 50 and the reticle 26 for exposure. Following this process, the images on the reticle 26 are sequentially exposed onto the fields of the wafer 30 so that the next field of the wafer 30 is brought into position relative to the lens assembly 50 and the reticle 26.

However, the use of the exposure apparatus 28 provided herein is not limited to a photolithography system for semiconductor manufacturing. The exposure apparatus 28, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Moreover, the stage assembly 10 provided herein can be used in other devices, including other semiconductor processing equipment, machine tools, metal cutting machines, and inspection machines.

The illumination source of the illumination system 204 can be g-line (436 nm), i-line (365 nm), KrF excimer laser (248 nm), ArF excimer laser (193 nm) and $F_2$ laser (157 nm). Alternately, the illumination source 204 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the lens assembly 50 included in the photolithography system, the lens assembly 50 need not be limited to a reduction system. It could also be a 1x or magnification system.

With respect to a lens assembly 50, when far ultra-violet rays such as the excimer laser is used, glass materials such as quartz and fluorite that transmit far ultra-violet rays is preferable to be used. When the $F_2$ type laser or x-ray is used, the lens assembly 50 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask (reticle) stage, the linear motors can be either an air levitation type employing air bearings or a magnetic levitation type using Lorentz force or reactance force. Additionally, the stage could move along a guide, or it could be a guideless type stage which uses no guide. As far as is permitted, the disclosures in U.S. Pat. Nos. 5,623, 853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure Nos. 8-166475 and 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and cleanliness are controlled.

Figure 14:
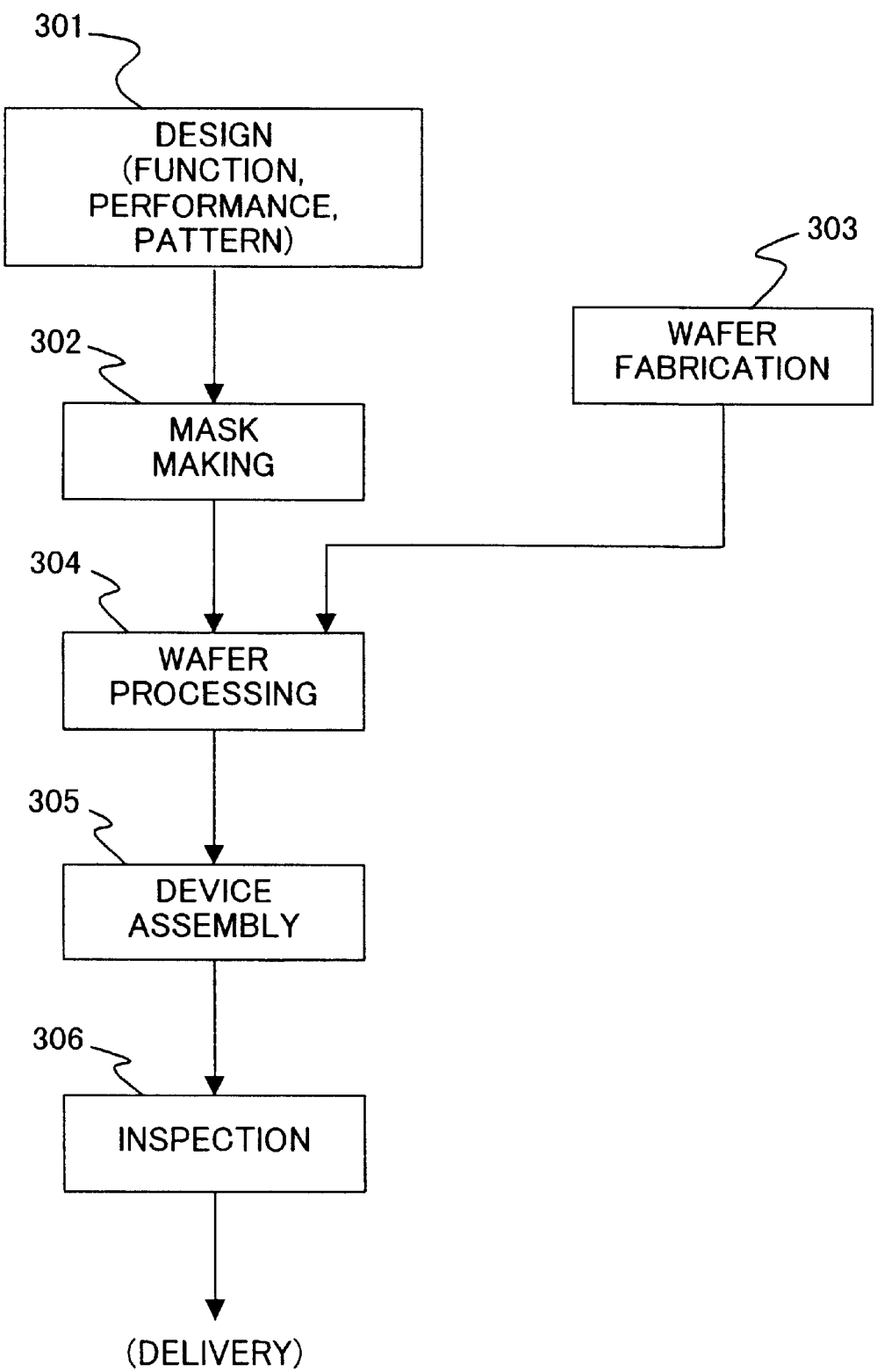
FIG. 14 is a flow chart that outlines a process for manufacturing a device in accordance with the present invention.

Further, semiconductor devices can be fabricated using the above described systems, by the process shown generally in FIG. 14. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), then finally the device is inspected in step 306.

Figure 15:
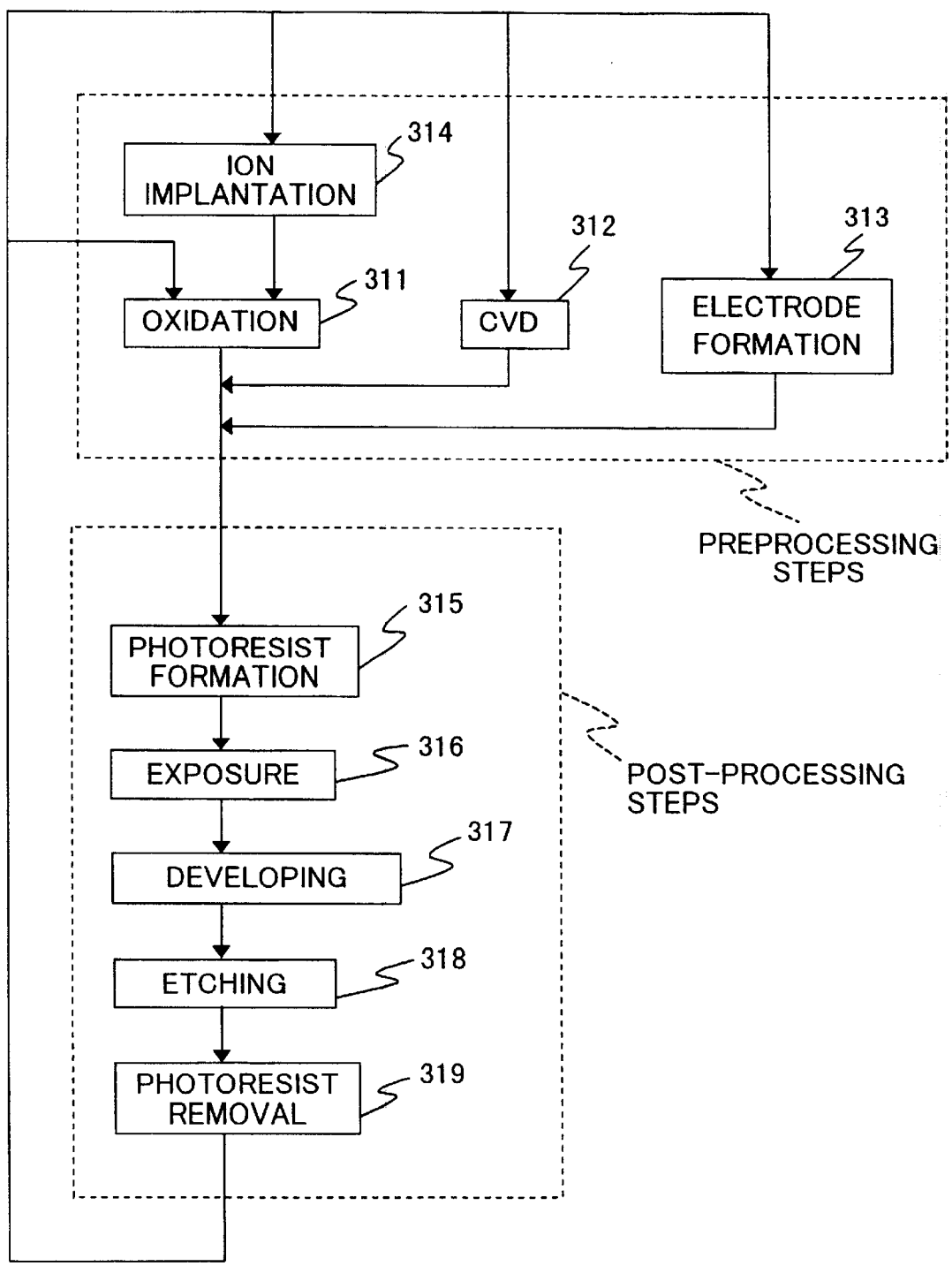
FIG. 15 is a flow chart that outlines device processing in more detail.

FIG. 15 illustrates a detailed flowchart example of the above-mentioned step 304 in the case of fabricating semiconductor devices. In FIG. 15, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, firstly, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves an object along a Y axis, the stage assembly comprising:
    a fine stage including (i) a fine frame having a first fine frame side and an opposed second fine frame side, (ii) a holder adapted to retain the object, and (iii) a first portion of a fine Y mover, the first portion being secured to the fine frame between the first fine frame side and the second fine frame side; and
    a coarse stage including a coarse frame that moves along the Y axis and a second portion of the fine Y mover, the second portion interacting with the first portion of the fine Y mover to move the fine stage along the Y axis relative to the coarse stage.

2. The stage assembly of claim 1 wherein a combination of the fine stage and the object has a combined center of gravity and the second portion of the fine Y mover interacts with the first portion of the fine Y mover near the combined center of gravity.

3. The stage assembly of claim 1 wherein the fine Y mover is secured to the fine frame substantially entirely between the first fine frame side and the holder.

4. The stage assembly of claim 1 wherein the fine stage further comprises a first portion of a fine X mover and the coarse stage includes a second portion of the fine X mover that interacts with the first portion of the fine X mover to move the fine stage along an X axis.

5. The stage assembly of claim 4 wherein the fine X mover includes at least one attraction only actuator.

6. The stage assembly of claim 5 wherein each attraction only actuator is an E/I core actuator.

7. The stage assembly of claim 1 including a pair of fine X movers that move the fine stage along an X axis and about a Z axis, each fine X mover including a first portion that is part of the fine stage and a second portion that is part of the coarse stage.

8. The stage assembly of claim 1 wherein the fine Y mover includes at least one attraction only actuator.

9. The stage assembly of claim 8 wherein each attraction only actuator is an E/I core actuator.

10. The stage assembly of claim 1 wherein the coarse stage further comprises a first portion of a coarse Y mover, and wherein the stage assembly includes a second portion of the coarse Y mover that interacts with the first portion of the coarse Y mover to move the coarse stage along the Y axis.

11. The stage assembly of claim 10 wherein a combination of the fine stage, the object and the coarse stage has combination center of gravity and the coarse Y mover is positioned near the combination center of gravity.

12. The stage assembly of claim 10 further comprising a mounting frame and a reaction assembly supported by the mounting frame.

13. The stage assembly of claim 12 wherein the reaction assembly supports the coarse stage.

14. The stage assembly of claim 12 wherein the second portion of the coarse Y mover is secured to a reaction assembly, and the reaction assembly minimizes the reaction forces that are transferred from the coarse Y mover to the mounting frame.

15. The stage assembly of claim 12 including a trim mover that is adapted to move the reaction assembly relative to the mounting frame.

16. The stage assembly of claim 1 further comprising a mechanism that urges the fine stage towards coarse stage substantially along a Z axis to counteract the weight of the fine stage.

17. The stage assembly of claim 16 wherein the mechanism includes a first portion secured to the fine stage and a second portion secured to the coarse stage.

18. The stage assembly of claim 16 wherein the mechanism includes at least one attraction only actuator.

19. The stage assembly of claim 16 further comprising a stage base that supports the fine stage substantially along the Z axis.

20. The stage assembly of claim 1 wherein the fine stage is free to move with at least three degrees of freedom.

21. The stage assembly of claim 20 wherein the coarse stage is free to move with at least three degrees of freedom.

22. An exposure apparatus including the stage assembly of claim 1.

23. A device manufactured with the exposure apparatus according to claim 22.

24. A wafer on which an image has been formed by the exposure apparatus of claim 22.

25. A stage assembly that moves an object along a Y axis relative to a mounting frame, the stage assembly comprising:
    a holder adapted to retain the object;
    a coarse stage including (i) a coarse frame having a first coarse frame side and an opposed second coarse frame side, and (ii) a first portion of a coarse Y mover, the first portion being secured to the coarse frame between the first coarse frame side and the second coarse frame side; and
    a reaction assembly including a second portion of the coarse Y mover, the second portion interacting with the first portion of the coarse Y mover to move the coarse stage along the Y axis relative to the reaction assembly, the reaction assembly minimizing the reaction forces along the Y axis that are transferred to the mounting frame.

26. The stage assembly of claim 25 further comprising a fine stage including (i) a fine frame having a first fine frame side and an opposed second fine frame side, and (ii) a first portion of a fine Y mover, the first portion being secured to the fine frame between the first fine frame side and the second fine frame side; wherein the coarse stage includes a second portion of the fine Y mover, the second portion interacting with the first portion of the fine Y mover to move the fine stage along the Y axis relative to the coarse stage.

27. The stage assembly of claim 26 wherein a combination of the fine stage and the object has a combined center of gravity and the second portion of the fine Y mover interacts with the first portion of the fine Y mover near the combined center of gravity.

28. The stage assembly of claim 26 wherein the first portion of the fine Y mover is secured to the fine frame between the first fine frame side and the holder.

29. The stage assembly of claim 26 wherein the fine stage further comprises a first portion of a fine X mover and the coarse stage includes a second portion of the fine X mover that interacts with the first portion of the fine X mover to move the fine stage along an X axis.

30. The stage assembly of claim 29 wherein the fine X mover includes at least one attraction only actuator.

31. The stage assembly of claim 30 wherein each attraction only actuator is an E/I core actuator.

32. The stage assembly of claim 26 wherein the fine Y mover includes at least one attraction only actuator.

33. The stage assembly of claim 32 wherein each attraction only actuator is an E/I core type actuator.

34. The stage assembly of claim 26 wherein a combination of the fine stage, the object and the second stage has a combination center of gravity and the coarse Y mover is positioned near the combination center of gravity.

35. The stage assembly of claim 26 further comprising a mechanism that urges the fine stage towards coarse stage substantially along a Z axis to counteract the weight of the fine stage.

36. The stage assembly of claim 35 wherein the mechanism includes at least one attraction only actuator.

37. The stage assembly of claim 35 further comprising a stage base that supports the fine stage along the Z axis.

38. The stage assembly of claim 25 including a trim mover that is adapted to move the reaction assembly relative to the mounting frame.

39. An exposure apparatus including the stage assembly of claim 25.

40. A device manufactured with the exposure apparatus according to claim 39.

41. A wafer on which an image has been formed by the exposure apparatus of claim 39.

42. A stage assembly that moves an object along a Y axis, the stage assembly comprising:
    a fine stage adapted to move along the Y axis, the fine stage including (i) a fine frame having a first fine frame side and an opposed second fine frame side, (ii) a holder adapted to retain the object, and (iii) a first portion of a mechanism that urges the fine stage substantially along a Z axis;
    a stage base that guides and supports the fine stage along the Z axis; and
    a coarse stage including a second portion of the mechanism that interacts with the first portion of the mechanism to urge the fine stage upwards substantially along the Z axis.

43. The stage assembly of claim 42 wherein a combination of the fine stage and the object has a combined center of gravity and the mechanism is positioned near the combined center of gravity.

44. The stage assembly of claim 42 wherein the mechanism is positioned near a fine Y mover that is adapted to move the fine stage relative to the coarse stage along the Y axis.

45. The stage assembly of claim 42 wherein the mechanism includes at least one attraction only actuator.

46. The stage assembly of claim 45 wherein each attraction only actuator is an E/I core actuator.

47. An exposure apparatus including the stage assembly of claim 42.

48. A device manufactured with the exposure apparatus according to claim 47.

49. A wafer on which an image has been formed by the exposure apparatus of claim 47.

50. The stage assembly of claim 42 wherein the fine stage is free to move with at least three degrees of freedom.

51. The stage assembly of claim 50 wherein the coarse stage is free to move with at least three degrees of freedom.

52. The stage assembly of claim 42 wherein the coarse stage is free to move with at least three degrees of freedom.

53. A method for moving an object along a Y axis, the method comprising the steps of:
    providing a fine stage including (i) a fine frame having a first fine frame side and an opposed second fine frame side and (ii) a holder that retains the object, the holder being positioned between the first fine frame side and the second fine frame side, and
    moving the fine stage along the Y axis with a fine Y mover that substantially only engages the fine frame between the first fine frame side and the holder.

54. The method of claim 53 wherein the step of moving the fine stage includes substantially only engaging the fine frame with the fine Y mover near a combined center of gravity of the fine stage and the object.

55. A method for making a stage assembly adapted for moving an object along a Y axis, the method comprising the steps of:
    providing a fine stage including (i) a fine frame having a first fine frame side and an opposed second fine frame side, and (ii) a holder adapted to retain the object, the holder being positioned between the first fine frame side and the second fine frame side; and
    providing a fine Y mover that only engages the fine stage between the first fine frame side and the holder and moves the fine stage along the Y axis.

56. A method for making an exposure apparatus that forms an image on an wafer, the method comprising the steps of:
    providing an irradiation apparatus that irradiates the wafer with radiation to form the image on the wafer; and
    providing the stage assembly made by the method of claim 55.

57. A method of making a wafer utilizing the exposure apparatus made by the method of claim 56.

58. A method of making a device including at least the exposure process: wherein the exposure process utilizes the exposure apparatus made by the method of claim 56.

59. A stage assembly that moves an object along a Y axis, the stage assembly comprising:
    a fine stage adapted to move along the Y axis, the fine stage including (i) a fine frame having a first fine frame side and an opposed second fine frame side, (ii) a holder adapted to retain the object, and (iii) a first portion of a mechanism;
    a stage base that is adapted to guide the fine stage along a Z axis; and
    a coarse stage adapted to move with at least three degrees of freedom, the coarse stage including a second portion of the mechanism that interacts with the first portion of the mechanism to urge the fine stage upwards.

60. The stage assembly of claim 59 wherein the fine stage is free to move with at least three degrees of freedom.

61. The stage assembly of claim 59 wherein a combination of the fine stage and the object has a combined center of gravity and the mechanism is positioned near the combined center of gravity.

62. The stage assembly of claim 59 wherein the mechanism is positioned near a fine Y mover that is adapted to move the fine stage relative to the coarse stage along the Y axis.

63. The stage assembly of claim 59 wherein the mechanism includes at least one attraction only actuator.

64. The stage assembly of claim 63 wherein each attraction only actuator is an E/I core actuator.

65. An exposure apparatus including the stage assembly of claim 59.

66. A device manufactured with the exposure apparatus according to claim 65.

67. A wafer on which an image has been formed by the exposure apparatus of claim 65.

* * * * *